(12) United States Patent
Sato et al.

(10) Patent No.: US 8,207,586 B2
(45) Date of Patent: Jun. 26, 2012

(54) SUBSTRATE BONDED MEMS SENSOR

(75) Inventors: Kiyoshi Sato, Niigata-Ken (JP); Kiyoshi Kobayashi, Niigata-Ken (JP); Yoshitaka Uto, Niigata-Ken (JP); Katsuya Kikuiri, Niigata-Ken (JP); Kazuyoshi Takahashi, Niigata-Ken (JP); Jun Suzuki, Niigata-Ken (JP); Hideki Gochou, Niigata-Ken (JP); Toru Takahashi, Niigata-Ken (JP); Hisanobu Ohkawa, Niigata-Ken (JP)

(73) Assignee: Alps Electric Co., Ltd., Tokyo (JP)

( * ) Notice: Subject to any disclaimer, the term of this patent is extended or adjusted under 35 U.S.C. 154(b) by 161 days.

(21) Appl. No.: 12/560,645

(22) Filed: Sep. 16, 2009

(65) Prior Publication Data

US 2010/0072563 A1    Mar. 25, 2010

(30) Foreign Application Priority Data

Sep. 22, 2008 (JP) ................................. 2008-242020
Sep. 22, 2008 (JP) ................................. 2008-242025
Sep. 22, 2008 (JP) ................................. 2008-242026

(51) Int. Cl.
*H01L 29/84* (2006.01)

(52) U.S. Cl. ........ 257/415; 257/416; 257/417; 257/418; 257/419

(58) Field of Classification Search ................... 257/415, 257/417–419
See application file for complete search history.

(56) References Cited

U.S. PATENT DOCUMENTS

| | | | |
|---|---|---|---|
| 6,958,529 B2* | 10/2005 | Ishibashi et al. | 257/678 |
| 7,345,867 B2* | 3/2008 | Fukuda et al. | 361/283.1 |
| 7,888,754 B2* | 2/2011 | Omura et al. | 257/419 |
| 7,919,814 B2* | 4/2011 | Goto et al. | 257/350 |
| 2003/0155622 A1* | 8/2003 | Ishibashi et al. | 257/414 |
| 2004/0226377 A1* | 11/2004 | Tsugai | 73/514.32 |
| 2005/0202585 A1* | 9/2005 | Eskridge | 438/50 |
| 2006/0208326 A1* | 9/2006 | Nasiri et al. | 257/414 |
| 2007/0115609 A1* | 5/2007 | Fukuda et al. | 361/283.1 |
| 2007/0290308 A1 | 12/2007 | Kim et al. | |
| 2008/0290490 A1* | 11/2008 | Fujii et al. | 257/684 |
| 2009/0050988 A1* | 2/2009 | Suzuki et al. | 257/415 |
| 2009/0140356 A1* | 6/2009 | Yazdi | 257/415 |
| 2010/0032775 A1* | 2/2010 | Morris et al. | 257/415 |
| 2010/0044808 A1* | 2/2010 | Dekker et al. | 257/415 |
| 2010/0252898 A1* | 10/2010 | Tanaka et al. | 257/415 |
| 2010/0270630 A1* | 10/2010 | Fujii et al. | 257/415 |
| 2011/0001198 A1* | 1/2011 | Sawyer | 257/415 |

FOREIGN PATENT DOCUMENTS

EP    2165970 A2 *  3/2010
JP    2000-307018    11/2000

* cited by examiner

*Primary Examiner* — Eugene Lee
*Assistant Examiner* — Mohammed Shamsuzzaman
(74) *Attorney, Agent, or Firm* — Brinks Hofer Gilson & Lione

(57) ABSTRACT

A MEMS sensor includes a first substrate; a second substrate; a movable electrode portion and a fixed electrode portion which are arranged between the first substrate and the second substrate, wherein: conductive supporting portions of the movable electrode portion and the fixed electrode portion are, respectively, fixedly secured to a surface of the first substrate via a first insulating layer; a second insulating layer, a lead layer buried into the second insulating layer, and connection electrode portions that are electrically connected to the lead layer to be individually connected to the conductive supporting portions are provided on a surface of the second substrate; a metallic connection layer is formed on the surface of one of the respective conductive supporting portions; one of the respective connection electrode portions and the metallic connection layer are bonded together by eutectic bonding or diffusion bonding; and, at least each of the connection electrode portions has a thickness of about 4 μm or smaller.

4 Claims, 11 Drawing Sheets

SUBSTRATE BONDED MEMS SENSOR

CROSS REFERENCE TO RELATED APPLICATION

The present invention contains subject matter related to and claims priority to Japanese Patent Applications JP 2008-242020, JP 2008-242025, and JP 2008-242026 filed in the Japanese Patent Office on Sep. 22, 2008, the entire contents of which being incorporated herein by reference.

BACKGROUND

1. Technical Field

The present invention relates to MEMS (Micro-Electro-Mechanical Systems) sensors which are formed by microfabricating a silicon layer, and more particularly, to an MEMS sensor which has a low profile and exhibits an excellent ability to hermetically seal a movable region.

2. Related Art

MEMS sensors are formed with a movable electrode portion and a fixed electrode portion by microfabricating a silicon (Si) wafer that constitutes an SOI (Silicon on Insulator) layer. The micro sensors can be used as acceleration sensors, pressure sensors, vibrating gyro-sensors, or micro relays, depending on the operation of the movable electrode portion.

In such MEMS sensors, it is necessary to hermetically seal the movable region of the movable electrode portion so that the movable electrode portion formed in a portion of the silicon wafer can be operated within a very small distance in a clean space.

According to the packaging technique disclosed in JP-A-2000-307018, a movable electrode portion and a fixed electrode portion which are formed from a silicon wafer constituting an SOI layer are disposed between upper and lower glass substrates, and the upper and lower glass substrates are bonded together by a glass frit seal on the circumferential portion of a movable region of the movable electrode portion, whereby a sealing layer is formed by the glass frit seal.

However, according to the technique disclosed in JP-A-2000-307018, since the packaging structure has the movable electrode portion enclosed between two sheets of glass substrates, the overall thickness dimension of the sensor is large.

Moreover, since the opposing distance of the upper and lower glass substrates is determined by the thickness of the glass frit seal that hermetically seals the circumference of the movable region of the movable electrode portion, it is difficult to define the opposing distance of the glass substrates with high precision. As a result, it is difficult to provide an appropriate movable clearance (margin) between the movable electrode portion and the glass substrates, necessary for the operation of the movable electrodes.

Moreover, since the glass frit seal is melted down and solidified to form a sealing layer, it is difficult to form a sealing layer with a fine pattern. Furthermore, to prevent the molten glass frit seal from flowing into the movable region of the movable electrodes, it is necessary to leave a distance between the movable region of the movable electrodes and the sealing layer of the glass frit seal. Therefore, the overall size of the package becomes too large.

Furthermore, in this kind of MEMS sensor, for miniaturization of the sensor, it is necessary to form electrode layers or lead layers on portions where the movable region of the movable electrode portion is superimposed. Therefore, it is necessary to ensure a marginal dimension between these electrode layers or lead layers and the movable electrode layer, which makes it difficult to realize a low profile of the package.

SUMMARY

According to an aspect of the disclosure, there is provided an MEMS sensor including: a first substrate; a second substrate; a movable electrode portion and a fixed electrode portion which are arranged between the first substrate and the second substrate, wherein: conductive supporting portions of the movable electrode portion and the fixed electrode portion are, respectively, fixedly secured to a surface of the first substrate via a first insulating layer; a second insulating layer, a lead layer buried into the second insulating layer, and connection electrode portions that are electrically connected to the lead layer to be individually connected to the conductive supporting portions are provided on a surface of the second substrate; and a metallic connection layer is formed on the surface of one of the respective conductive supporting portions; and, one of the respective connection electrode portions and the metallic connection layer are bonded together by eutectic bonding or diffusion bonding.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts throughout the different views.

DESCRIPTION OF EXEMPLARY EMBODIMENTS

Exemplary embodiments may be better understood with reference to the drawings, but these examples are not intended to be of a limiting nature. Like numbered elements in the same or different drawings perform equivalent functions.

[First Embodiment]

Figure 1:
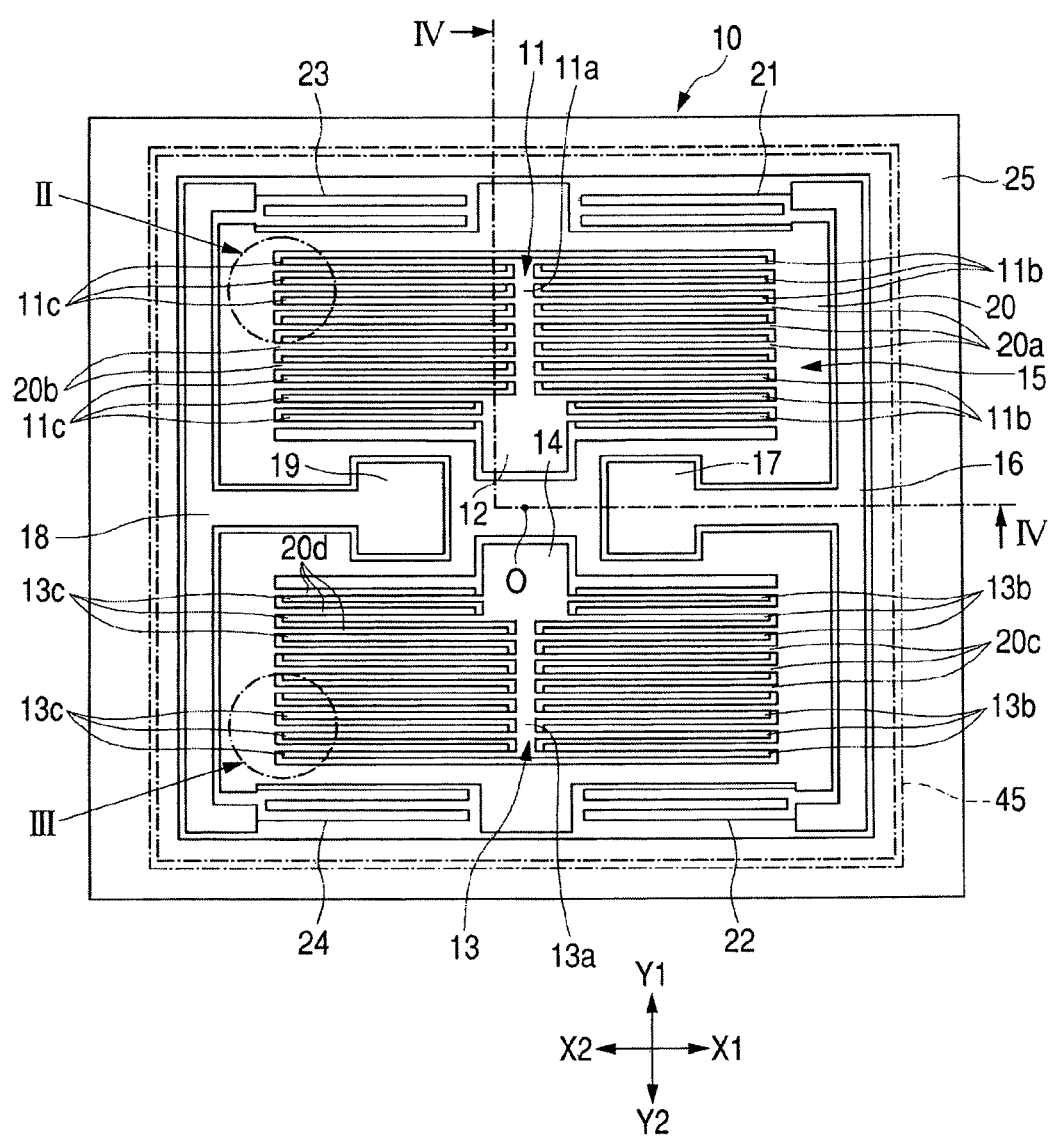
FIG. 1 is a top plan view illustrating a pattern for separating a movable electrode portion of a MEMS sensor according to a first embodiment of the invention from a fixed electrode portion and a frame layer.
Figure 2:
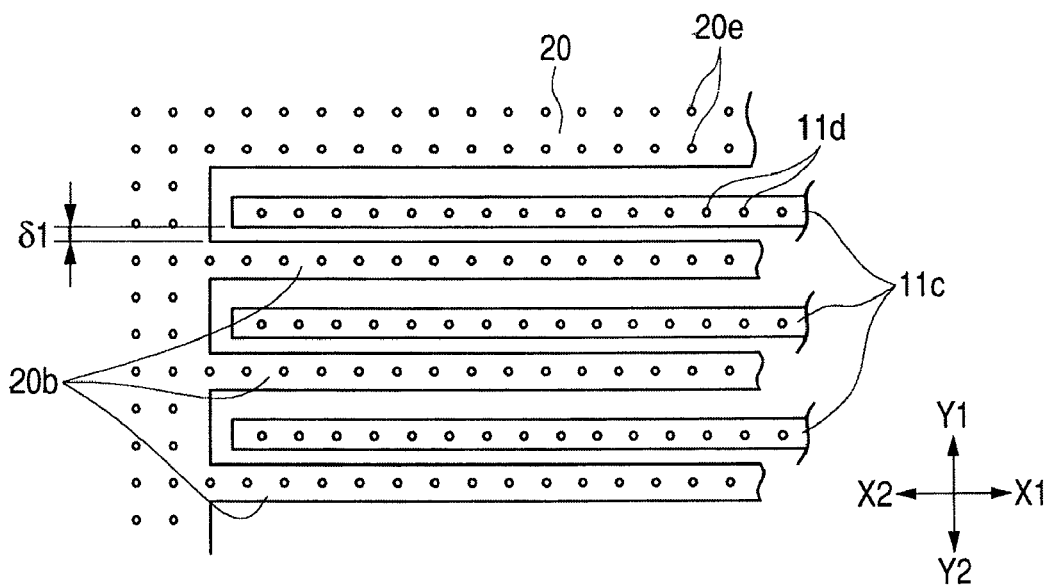
FIG. 2 is an enlarged top plan view of the portion indicated by the arrow II in FIG. 1.
Figure 3:
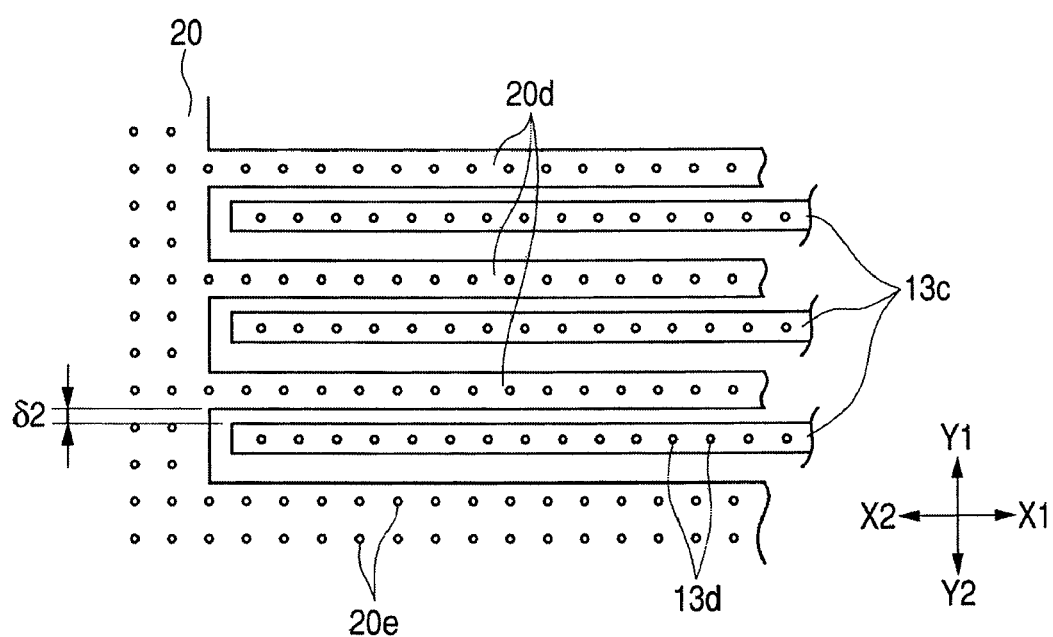
FIG. 3 is an enlarged top plan view of the portion indicated by the arrow III in FIG. 1.
Figure 4:
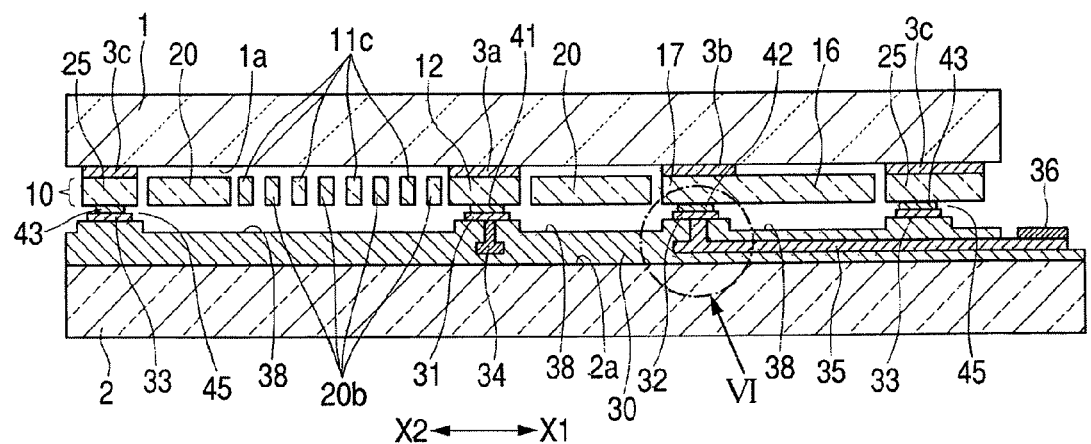
FIG. 4 is a cross-sectional view illustrating the stack structure of the MEMS sensor, taken along the IV-IV lines in FIG. 1.
Figure 5:
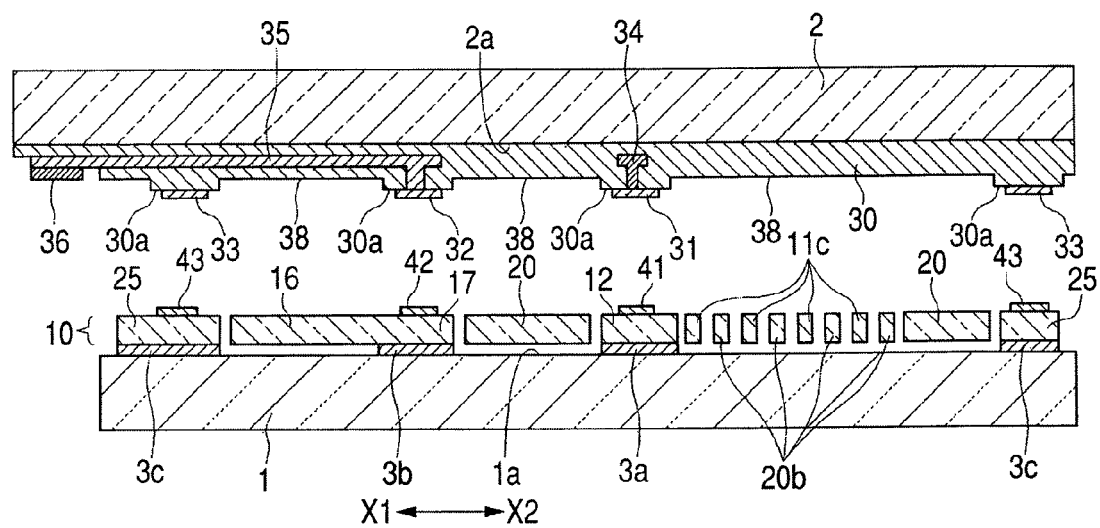
FIG. 5 is a cross-sectional view illustrating the method for fabricating the MEMS sensor.

FIG. 1 is a top plan view of a MEMS sensor according to the first embodiment of the invention, illustrating movable electrode portion, a fixed electrode portion, and a frame layer. In FIG. 1, the illustrations of a first substrate and a second substrate are omitted. FIG. 2 is an enlarged view of the II portion in FIG. 1, and FIG. 3 is an enlarged view of the III portion in FIG. 1. FIG. 4 is a cross-sectional view illustrating the overall structure of the MEMS sensor, taken along the IV-IV lines in FIG. 1. FIG. 5 is a cross-sectional view for describing the method for fabricating the MEMS sensor. In FIGS. 4 and 5, the arrangements of respective layers are reversed upside down.

As illustrated in FIG. 4, the MEMS sensor has such a configuration that a functional layer 10 is sandwiched between a first substrate 1 and a second substrate 2. The respective portions of the functional layer 10 and the first substrate 1 are bonded together via a first insulating layer 3a, 3b, or 3c. Moreover, a second insulating layer 30 is provided between the second substrate 2 and the functional layer 10.

The first substrate 1, the functional layer 10, and the first insulating layer 3a, 3b, or 3c are formed by processing an SOI (Silicon on Insulator) layer. The SOI layer used herein is composed of two silicon wafers which are bonded together via an insulating layer (insulator), which is a $SiO_2$ layer. One silicon wafer of the SOI layer is used as the first substrate 1, and the other silicon wafer is processed to form the functional layer 10.

The functional layer 10 is formed from one sheet of silicon wafer which is divided into a first fixed electrode portion 11, a second fixed electrode portion 13, a movable electrode portion 15, and a frame layer 25. Moreover, portions of the insulating layer of the SOI layer are removed to form the first insulating layers 3a, 3b, and 3c which are spaced apart from each other.

As illustrated in FIG. 1, the functional layer 10 has a planar shape which is rotationally symmetric through 180 degrees around the center O (of the drawing) and is linearly symmetric in the vertical direction (Y direction) about the line passing through the center O and extending in the X direction.

As illustrated in FIG. 1, the first fixed electrode portion 11 is provided closer to the Y1 side than the center O. In the first fixed electrode portion 11, a rectangular conductive supporting portion 12 is formed to be integral therewith at a position close to the center O. As illustrated in FIGS. 4 and 5, the conductive supporting portion 12 is fixedly secured to a surface 1a of the first substrate 1 via the first insulating layer 3a. In the first fixed electrode portion 11, only the conductive supporting portion 12 is fixedly secured to the surface 1a of the first substrate 1 via the first insulating layer 3a. In the remaining portions thereof, the insulating layer between the first fixed electrode portion 11 and the first substrate 1 is removed, so that a clearance gap corresponding to the thickness of the first insulating layer 3a is defined between the first fixed electrode portion 11 and the surface 1a of the first substrate 1.

As illustrated in FIG. 1, the first fixed electrode portion 11 is provided with an electrode supporting portion 11a which has a constant width dimension and is linearly extended from the conductive supporting portion 12 in the Y1 direction. On the X1 side of the electrode supporting portion 11a, a plurality of counter electrodes 11b is formed to be integral therewith. On the X2 side of the electrode supporting portion 11a, a plurality of counter electrodes 11c is formed to be integral therewith. In FIG. 2, only the counter electrodes 11c on the X2 side are illustrated. The plurality of counter electrodes 11c are all linearly extended in the X2 direction and the width dimensions in the Y direction are constant. Moreover, the plurality of counter electrodes 11c is arranged in a comb-teeth shape at equal intervals in the Y direction. The other counter electrodes 11b extending toward the X1 side and the counter electrodes 11c extending in the X2 direction are bilaterally symmetric about the line passing through the center O and extending in the Y direction.

The second fixed electrode portion 13 is provided closer to the Y2 side than the center O. The second fixed electrode portion 13 and the first fixed electrode portion 11 are symmetric in the vertical direction (Y direction) about the line passing through the center O and extending in the X direction. That is to say, the second fixed electrode portion 13 is provided with a rectangular conductive supporting portion 14 which is provided close to the center O and an electrode supporting portion 13a which has a constant width dimension and is linearly extended from the conductive supporting portion 14 in the Y2 direction. On the X1 side of the electrode supporting portion 13a, a plurality of counter electrodes 13b is formed to be integral therewith and extend from the electrode supporting portion 13a. On the X2 side of the electrode supporting portion 13a, a plurality of counter electrodes 13c is formed to be integral therewith and extend from the electrode supporting portion 13a.

As illustrated in FIG. 3, the counter electrodes 13c are linearly extended in the X2 direction, respectively have a constant width dimension, and are formed in parallel to each other at equal intervals in the Y direction. Similarly, the counter electrodes 13b on the X1 side are linearly extended in the X1 direction and respectively have a constant width dimension, and are formed in parallel to each other at equal intervals in the Y direction.

In the second fixed electrode portion 13, only the conductive supporting portion 14 is fixedly secured to the surface 1a of the first substrate 1 via the first insulating layer 3a. In the remaining portions thereof, namely in the electrode supporting portion 13a and the counter electrodes 13b and 13c, the insulating layer between the second fixed electrode portion 13 and the surface 1a of the first substrate 1 is removed, so that a clearance gap corresponding to the thickness of the first insulating layer 3a is defined between the electrode supporting portion 13a and the counter electrode portions 13b and 13c, and the surface 1a of the first substrate 1.

The functional layer 10 illustrated in FIG. 1 is configured such that a movable region is defined inside the rectangular frame layer 25, and the movable electrode portion 15 is configured by portions of the movable region excluding the first fixed electrode portion 11 and the second fixed electrode portion 13. The movable electrode portion 15 is formed from the same silicon wafer which is divided into the first fixed electrode portion 11, the second fixed electrode portion 13, and the frame layer 25.

As illustrated in FIG. 1, the movable electrode portion 15 is provided with a first supporting arm portion 16, which is provided closer to the X1 side than the center O to be extended in the Y1-Y2 direction, and a rectangular conductive supporting portion 17, which is formed closer to the X1 side than the center O to be integral with the first supporting arm portion 16. The movable electrode portion 15 is further provided with a second supporting arm portion 18, which is provided closer to the X2 side than the center O to be extended in the Y1-Y2 direction, and a rectangular conductive supporting portion 19, which is formed closer to the X2 side than the center O to be integral with the second supporting arm portion 18.

A spindle part 20 is defined in a region that is sandwiched between the first supporting arm portion 16 and the second supporting arm portion 18, and by the portions excluding the first fixed electrode portion 11 and the second fixed electrode portion 13. The Y1-side edge of the spindle part 20 is supported by the first supporting arm portion 16 via an elastic supporting portion 21 and is also supported by the second supporting arm portion 18 via an elastic supporting portion 23. The Y2-side edge of the spindle part 20 is supported by the first supporting arm portion 16 via the elastic supporting portion 22 and is also supported by the second supporting arm portion 18 via the elastic supporting portion 24.

On the Y1 side of the center O, the spindle part 20 is provided with a plurality of movable counter electrodes 20a, which is formed to be integral with each other and extended from the X1-side edge of the spindle part 20 toward the X2 side, and a plurality of movable counter electrodes 20b, which is formed to be integral with each other and extended from the X2-side edge of the spindle part 20 toward the X1 side. As illustrated in FIG. 2, the movable counter electrodes 20b which are formed to be integral with the spindle part 20 are disposed to oppose the Y2 side of the counter electrodes 11c of the first fixed electrode portion 11 via a distance $\delta 1$ during the non-operating state. Similarly, the X1-side movable counter electrodes 20a are disposed to oppose the Y2 side of the counter electrodes 11b of the first fixed electrode portion 11 via a distance $\delta 1$ during the non-operating state.

On the Y2 side of the center O, the spindle part 20 is provided with a plurality of movable counter electrodes 20c, which is formed to be integral with each other and extend in parallel to each other from the X1-side edge of the spindle part 20 toward the X2 side, and a plurality of movable counter electrodes 20d, which is formed to be integral with each other and extend in parallel to each other from the X2-side edge of the spindle part 20 toward the X1 side.

As illustrated in FIG. 3, the movable counter electrodes 20d are disposed to oppose the Y1 side of the counter electrodes 13c of the second fixed electrode portion 13 via a distance $\delta 2$ during the non-operating state. The same relationship is applied to the relationship between the X1-side movable counter electrodes 20c and the counter electrodes 13b. The opposing distances $\delta 1$ and $\delta 2$ during the non-operating state are designed to be identical to each other.

As illustrated in FIG. 4, the conductive supporting portion 17 that is continuous to the first supporting arm portion 16 and the surface 1a of the first substrate 1 are fixedly secured together via the first insulating layer 3b. The conductive supporting portion 19 that is continuous to the second supporting arm portion 18 and the surface 1a of the first substrate 1 are fixedly secured together via the first insulating layer 3b. In the movable electrode portion 15, only the conductive supporting portion 17 and the conductive supporting portion 19 are fixedly secured to the first substrate 1 via the first insulating layer 3b. In the remaining portions thereof, namely in the first supporting arm portion 16, the second supporting arm portion 18, the spindle part 20, the movable counter electrodes 20a, 20b, 20c, and 20d, and the elastic supporting portions 21, 22, 23, and 24, the insulating layer between the movable electrode portion 15 and the surface 1a of the first substrate 1 is removed, so that a clearance gap corresponding to the thickness dimension of the first insulating layer 3b is defined between these respective portions and the surface 1a of the first substrate 1.

The elastic supporting portions 21, 22, 23, and 24 are formed of a thin plated spring portion which is cut from a silicon wafer into a meandering pattern. By deformation of the elastic supporting portions 21, 22, 23, and 24, the spindle part 20 is able to move in the Y1 or Y2 direction.

As illustrated in FIG. 1, the frame layer 25 is formed by cutting the silicon wafer for forming the functional layer 10 into a rectangular frame shape. The first insulating layer 3c is left between the frame layer 25 and the surface 1a of the first substrate 1. The first insulating layer 3c is provided so as to surround the entire circumference of the movable region of the movable electrode portion 15.

The functional layer 10 illustrated in FIGS. 4 and 5 can be fabricated by the following method. First, using an SOI layer in which two sheets of silicon wafers are bonded together via an insulating layer, a resist layer is formed on the surface of one silicon wafer so as to cover the first fixed electrode portion 11, the second fixed electrode portion 13, the movable electrode portion 15, and the frame layer 25. Next, portions of the silicon wafer exposed from the resist layer are removed by an ion-etching means such as the deep RIE process that uses high-density plasma, whereby the first fixed electrode portion 11, the second fixed electrode portion 13, the movable electrode portion 15, and the frame layer 25 are spaced apart from each other.

At that time, a number of micropores are formed over all of the regions excluding the conductive supporting portions 12, 14, 17, and 19 and the frame layer 25 by the deep RIE process. Referring to FIGS. 2 and 3, micropores 1id are formed on the counter electrodes 11c, micropores 13d are formed on the counter electrodes 13c, and micropores 20e are formed on the spindle part 20.

After the silicon wafer is subjected to the etching process by the deep RIE process, or the like, a selective isotropic etching process is performed which is capable of dissolving the $SiO_2$ layer of the insulating layer without dissolving silicon. At this time, etching gas or etching solution permeates through grooves that separate the respective portions of the silicon wafer and further permeates through the micropores 11d, 13d, and 20e, whereby the insulating layer is removed.

As a result, the insulating layer are left as the first insulating layers 3a, 3b, and 3c only between the conductive supporting portions 12, 14, 17, and 19 and the frame layer 25, and the surface 1a of the first substrate 1, and the insulating layer in the remaining portions is removed.

The result of processing the SOI layer is as follows: the first substrate 1 has a thickness dimension of around 0.2 to 0.7 mm; the functional layer 10 has a thickness dimension of around 10 to 30 µm; and the first insulating layer 3a, 3b, or 3c has a thickness dimension of around 1 to 3 µm.

The second substrate 2 is formed of one sheet of silicon wafer having a thickness dimension of around 0.2 to 0.7 mm. A second insulating layer 30 is formed on a surface 2a of the second substrate 2. The second insulating layer 30 is an inorganic insulating layer of $SiO_2$, SiN, $Al_2O_3$, or the like, and is formed by a sputtering process or a CVD process. As the inorganic insulating layer, materials exhibiting a smaller difference in the thermal expansion coefficient from that of the silicon wafer than the difference in the thermal expansion coefficient between the conductive metal constituting the connection electrode portions and the silicon wafer are chosen. Preferably, materials such as $SiO_2$ or SiN are used which exhibit a relatively small difference in the thermal expansion coefficient from that of the silicon wafer.

As illustrated in FIGS. 4 and 5, on the surface of the second insulating layer 30, a connection electrode portion 31 configured to oppose the conductive supporting portion 12 of the first fixed electrode portion 11 and another connection electrode portion 31 (not illustrated) configured to oppose the conductive supporting portion 14 of the second fixed electrode portion 13 are formed. Moreover, on the surface of the second insulating layer 30, a connection electrode portion 32 configured to oppose the one conductive supporting portion 17 of the movable electrode portion 15 and another connection electrode portion 32 (not illustrated) configured to oppose the other conductive supporting portion 19 are formed.

On the surface of the second insulating layer 30, a sealing electrode portion 33 configured to oppose the surface of the frame layer 25 is formed. The sealing electrode portion 33 is formed of the same conductive metal as the connection electrode portions 31 and 32. The sealing electrode portion 33 is formed into a rectangular form to oppose the frame layer 25. Specifically, the sealing electrode portion 33 is formed on the circumference of the movable region of the movable electrode portion 15 so as to surround the entire circumference of the movable region. The connection electrode portions 31 and 32 and the sealing electrode portion 33 are formed of aluminum (Al).

Inside the second insulating layer 30, a lead layer 34 that is electrically connected to the one connection electrode portion 31 and a lead layer 35 that is electrically connected to the other connection electrode portion 32 are formed. The lead layers 34 and 35 are formed of aluminum. The plurality of lead layers 34 and 35 are individually electrically connected to respective connection electrode portions 31 and 32. The respective lead layers 34 and 35 are configured to pass through the inside of the second insulating layer 30 to intersect the portion where the sealing electrode portion 33 is formed, without contacting the sealing electrode portion 33, to be extended to the outside of the region surrounded by the sealing electrode portion 33. The second substrate 2 is provided with connection pads 36 which are electrically connected to the respective lead layers 34 and 35 at the outside of the region. The connection pads 36 are formed of aluminum, gold, and the like which are conductive materials having low resistance and which are not prone to being oxidized.

The second insulating layer 30 has such a configuration that the surface 30a having the connection electrode portions 31 and 32 formed thereon is even with the surface 30a having the sealing electrode portion 33 formed thereon. Moreover, on regions of the second insulating layer 30 on which the connection electrode portions 31 and 32 and the sealing electrode portion 33 are not present, concave portions 38 are formed to be recessed toward the surface 2a of the second substrate 2. The concave portions 38 are formed on the entire remaining portions of the second insulating layer 30 excluding the surface 30a opposing the conductive supporting portions 12, 14, 17, and 19 and the frame layer 25. Moreover, the concave portions 38 are formed to such a depth that they are halfway inside the second insulating layer 30 and that the lead layers 34 and 35 are not exposed to the outside.

The second insulating layer 30 can be formed by the following method. First, an inorganic insulating layer is formed to a uniform thickness on the surface 2a of the second substrate 2 by a sputtering process. On the inorganic insulating layer, the lead layers 34 and 35 are formed by a sputtering process, a CVD process, or the like. Another inorganic insulating layer is formed by a sputtering process so as to cover the lead layers 34 and 35. Thereafter, the surface 30a is polished to have an even surface, and the concave portions 38 are formed by an ion-milling process, or the like.

In this specification, the second insulating layer being formed with a uniform thickness means that after forming the second insulating layer on the surface of the convex portion and the concave portion of the second substrate by a sputtering process, a CVD process, or the like, any processing, particularly, for scraping the surface of the second insulating layer to form a concave portion is not performed. For example, the uniform thickness of the second insulating layer includes a state where at the boundary of the convex portion and the concave portion of the second substrate, the insulating layer is formed thinner than other regions.

However, in the disclosure, in portions of the second substrate opposing the concave portion, processing such as milling may be applied to the surface of the second insulating layer so that an additional concave portion may be formed on the surface of the second insulating layer. By doing so, due to the concave portion on the surface of the second substrate and the concave portion obtained by scraping the surface of the second insulating layer, it is possible to ensure an increased movable clearance between the movable electrode portion and the second insulating layer.

As illustrated in FIG. 5, a metallic connection layer 41 is formed on the surfaces of the conductive supporting portions 12 and 14 of the functional layer 10 so as to oppose the connection electrode portion 31 by a sputtering process. Similarly, another metallic connection layer 42 is formed on the surfaces of the conductive supporting portions 17 and 19 so as to oppose the connection electrode portion 32 by a sputtering process. Moreover, a metallic sealing layer 43 is formed on the surface of the frame layer 25 so as to oppose the sealing electrode portion 33. The metallic sealing layer is formed of the same metallic material as, and simultaneously with, the metallic connection layers 41 and 42.

The metallic connection layers 41 and 42 and the metallic sealing layer 43 are formed of germanium which is a metallic material that is likely to be bonded with aluminum for forming the connection electrode portions 31 and 32 and the sealing electrode portion 33 by eutectic bonding or diffusion bonding.

As illustrated in FIG. 4, the first substrate 1 and the second substrate 2 are superimposed so that the surface 1a faces the surface 2a, the connection electrode portion 31 faces the metallic connection layer 41, the connection electrode portion 32 faces the metallic connection layer 42, and the sealing electrode portion 33 faces the metallic sealing layer 43. Then, the first substrate 1 and the second substrate 2 are heated and pressurized with a small force. In this way, the connection electrode portion 31 and the metallic connection layer 41 are bonded together by eutectic bonding or diffusion bonding, and the connection electrode portion 32 and the metallic connection layer 42 are bonded together by eutectic bonding or diffusion bonding. By the eutectic bonding or the diffusion bonding between the connection electrode portions 31 and 32 and the metallic connection layers 41 and 42, the conductive supporting portions 12, 14, 17, and 19 are immovably sandwiched between the first insulating layers 3a and 3b and the second insulating layer 30. Moreover, the connection electrode portions 31 and 31 are individually electrically connected to the conductive supporting portions 12 and 14, and the connection electrode portions 32 and 32 are individually electrically connected to the conductive supporting portions 17 and 19.

At the same time, the sealing electrode portion 33 and the metallic sealing layer 43 are bonded together by eutectic bonding or diffusion bonding. By the eutectic bonding or the diffusion bonding, the frame layer 25 and the second insulating layer 30 are fixedly secured to each other, and a metallic sealing layer 45 is formed so as to surround the entire circumference of the movable region of the movable electrode portion 15.

Since the above-described MEMS sensor has such a structure that the SOI layer, which is composed of two sheets of silicon wafers bonded together via an insulating layer, is superimposed on another sheet of silicon wafer, it has a generally low profile. Moreover, the MEMS sensor has such a configuration that the conductive supporting portion 12 of the first fixed electrode portion 11, the conductive supporting portion 14 of the second fixed electrode portion 13, and the conductive supporting portions 17 and 19 of the movable electrode portion 15 are fixed by being sandwiched between the first insulating layers 3a and 3b and the second insulating layer 30, the conductive supporting portions 12, 14, 17, and 19 can be stably fixed.

The conductive supporting portions 12, 14, 17, and 19 and the second insulating layer 30 are bonded together by the eutectic bonding or the diffusion bonding between the connection electrode portions 31 and 32 and the metallic connection layers 41 and 42. However, the bonding layer is thin and occupies a small area, and the conductive supporting portions 12, 14, 17, and 19 and the first substrate 1 are bonded together via the first insulating layers 3a and 3b which are formed of an inorganic insulating material. Therefore, even when the ambient temperature increases, the thermal stress of the bonding layer hardly affects the support structure of the conductive supporting portions 12, 14, 17, and 19. Thus, deformation, or the like, of the fixed electrode portions 11 and 13 or the movable electrode portion 15 due to the thermal stress is not likely to occur.

Similarly, the metallic sealing layer 45 surrounding the circumference of the movable region of the movable electrode portion 15 is configured by a thin bonding layer which is formed between the frame layer 25 and the second insulating layer 30, where the frame layer 25 has a sufficiently large thickness dimension. Therefore, deformation, or the like, of the first substrate 1 and the second substrate 2 due to the thermal stress of the metallic sealing layer 45 is not likely to occur.

The overall thickness dimension of the MEMS sensor can be substantially determined by the thickness dimensions of the first substrate 1 and the second substrate 2, the thickness dimension of the functional layer 10, and the thickness dimension of the second insulating layer 30. Since the thickness dimensions of the respective layers can be controlled with high precision, a thickness variation is not likely to occur. Moreover, since the second insulating layer 30 is formed with the concave portions 38 which are configured to oppose the movable region of the movable electrode portion 15, even when the bonding layer is thin and generally has a low profile, it is possible to provide a movable clearance (margin) in the thickness direction to the movable electrode portion 15. Even when a large acceleration of force is applied in the thickness direction from the outside, the spindle part 20 and the movable counter electrodes 20a, 20b, 20c, and 20d might not come into contact with the second insulating layer 30, and thus, preventing any malfunction.

The MEMS sensor can be used as an acceleration sensor that detects an acceleration of force in the Y1 or Y2 direction. For example, when an acceleration of force in the Y1 direction is applied to the MEMS sensor, the spindle part 20 of the movable electrode portion 15 is moved in the Y2 direction by a counteracting force. At this time, the opposing distance $\delta 1$ between the movable counter electrodes 20b and the fixed-side counter electrodes 11c, as illustrated in FIG. 2, is increased, so that the electrostatic capacitance between the movable counter electrodes 20b and the counter electrodes 11c decreases. At the same time, the opposing distance $\delta 2$ between the movable counter electrodes 20d and the counter electrodes 13c as illustrated in FIG. 3 is decreased, so that the electrostatic capacitance between the movable counter electrodes 20b and the counter electrodes 13c increases.

By detecting the decrease and increase in the electrostatic capacitance using an electric circuit and calculating a difference between a change in output due to the increase of the opposing distance $\delta 1$ and a change in output due to the decrease of the opposing distance $\delta 2$, it is possible to detect a change in the acceleration acting in the Y1 direction or the magnitude of the acceleration.

The MEMS sensor according to the invention may be configured to detect a change in the electrostatic capacitance between the movable counter electrodes and the counter electrodes in response to an acceleration of force in the direction perpendicular to the X-Y plane. Specifically, when the spindle part 20 of the movable electrode portion 15 is moved in the thickness direction in response to an acceleration of force in the direction perpendicular to the X-Y plane, the opposing state between the counter electrodes 11b, 11c, 13b, and 13c of the fixed electrode portions 11 and 13 and the movable counter electrodes 20a, 20b, and 20c of the movable electrode portion 15 is deviated in the thickness direction of the movable electrode portion 15, and thus the opposing area changes. The change in the opposing area is detected by the MEMS sensor as a change in the electrostatic capacitance between the movable counter electrodes and the counter electrodes of the fixed electrode portions 11 and 13.

[Second Embodiment]

Figure 6A:
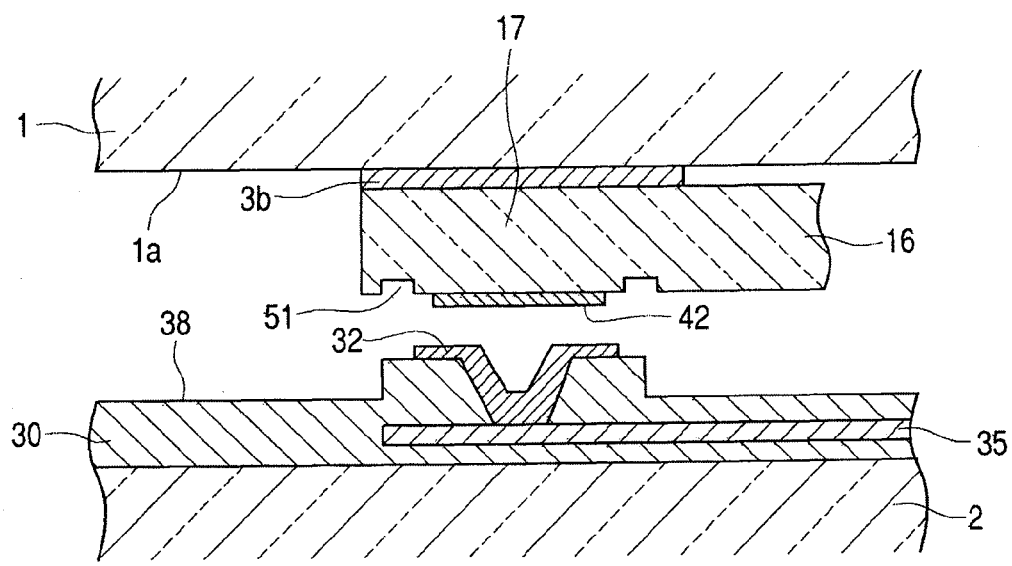
FIGS. 6A and 6B are enlarged cross-sectional views, of each embodiment, illustrating the detailed structure of the portion indicated by the arrow VI in FIG. 4.
Figure 6B:
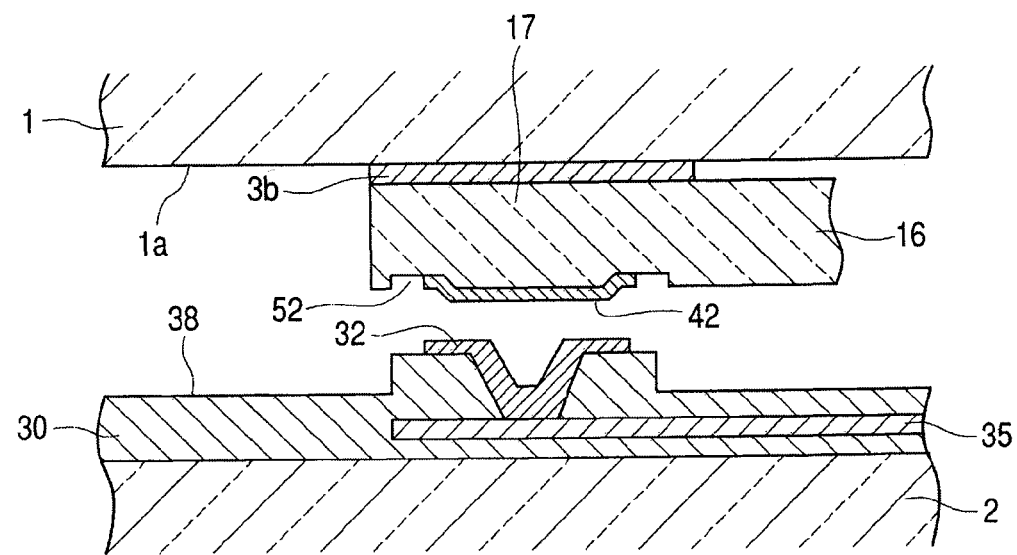

FIGS. 6A and 6B are cross-sectional views of a MEMS sensor according to the second embodiment of the invention, illustrating the VI portion in FIG. 4 in the enlarged views.

In the embodiment illustrated in FIG. 6A, on the surface of the conductive supporting portion 17 of the movable electrode portion 15, a groove 51 is formed so as to surround the bonding portion in which the metallic connection layer 42 and the connection electrode portion 32 are bonded together by eutectic bonding or diffusion bonding. The groove 51 may be continuously formed so as to surround the entire circumference of the bonding portion or may be discontinuously formed at intervals so as to surround the bonding portion.

In the embodiment illustrated in FIG. 6B, on the surface of the conductive supporting portion 17 of the movable electrode portion 15, a groove 52 is formed so as to surround the bonding portion of the metallic connection layer 42 and the connection electrode portion 32. The groove 52 is continuously formed so as to surround the circumference of the bonding layer, and a portion of the metallic connection layer 42 is formed so as to be extended to the inside of the groove 52.

In the embodiments illustrated in FIGS. 6A and 6B, when the connection electrode portion 32 and the metallic connection layer 42 are bonded together by eutectic bonding or diffusion bonding, the molten metal is blocked at the groove 51 or 52. Therefore, it is possible to more certainly prevent the molten metal from flowing into the movable region of the spindle part 20 of the movable electrode portion 15 or the electrode opposing portion illustrated in FIGS. 2 and 3.

Although in the above-described embodiment, the connection electrode portions 31 and 32 and the sealing electrode portion 33 are formed of aluminum and the metallic connection layers 41 and 42 and the metallic sealing layer 43 are formed of germanium, combinations of metals capable of realizing eutectic bonding or diffusion bonding include aluminum-zinc, gold-silicon, gold-indium, gold-germanium, gold-tin, and the like. These combinations of metals enable bonding to be performed at a relatively low temperature of 450° C. or lower, which is equal to or lower than the melting point of the metals.

[Third Embodiment]

Figure 7:
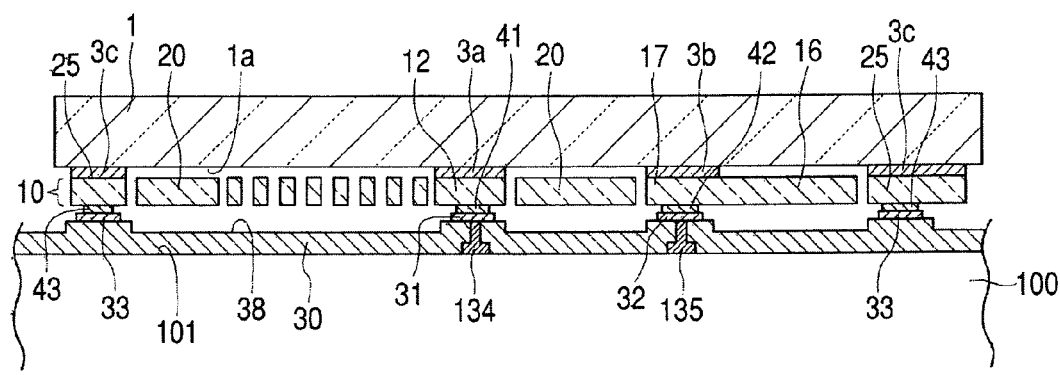
FIG. 7 is a cross-sectional view illustrating a third embodiment that uses an IC package in lieu of a second substrate.

FIG. 7 is a cross-sectional view illustrating the MEMS sensor according to the third embodiment of the invention.

The MEMS sensor uses an IC package 100 instead of the second substrate 2. The IC package 100 incorporates therein a detection circuit, or the like, capable of detecting a change in the electrostatic capacitance between the counter electrodes and the movable counter electrodes.

The second insulating layer 30 is formed on an upper surface 101 of the IC package 100, and the connection electrode portions 31 and 32 and the sealing electrode portion 33 are formed on the surface of the second insulating layer 30. The connection electrode portions 31 and 32 are electrically connected to electrode pads that appear on the upper surface 101 of the IC package 100 via connection layers 134 and 135 such as through-holes configured to penetrate through the second insulating layer 30 and are connected to an electric circuit incorporated into the IC package 100.

In the MEMS sensor illustrated in FIG. 7, the functional layer 10 is disposed between the first substrate 1 and the second insulating layer 30, and the second insulating layer 30 is formed with a thickness dimension that can be controlled. Therefore, it is possible to stably hold the functional layer 10 without it greatly protruding from the upper surface 101 of the IC package 100.

Figure 8:
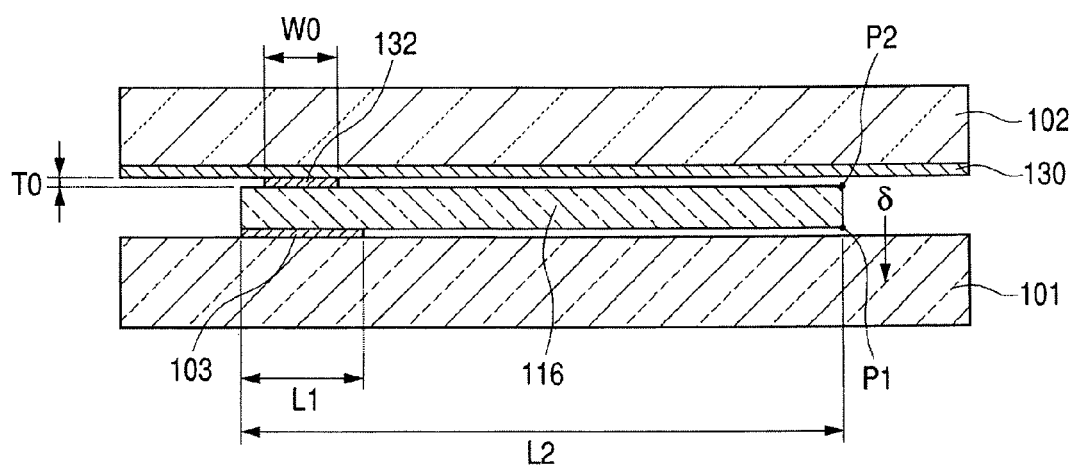
FIG. 8 is an explanatory view of a simulation model for calculating the optimum value of the thickness of a connection electrode portion or a bonding layer.

FIG. 8 illustrates a simulation model for calculating the optimum value of the thickness dimension of the connection electrode portions 31 and 32 or the bonding layer. It will be assumed that the first substrate 101, the fixed electrode portion 116, and the first insulating layer 103 are processed from an SOI layer, and the first substrate 101 and the fixed electrode portion 116 are silicon wafers, and the first insulating layer 103 is a $SiO_2$ layer. The second substrate 102 is a silicon wafer, and the second insulating layer 130 is a $SiO_2$ layer. In this simulation, the thermal stress was calculated for the bonding layer 132 which is configured as a single layer of aluminum.

The material properties used for the calculation were as follows:

Young's Modulus ($N/m^2$) was 1.50E+11 for Si, 7.20E+10 for $SiO_2$, and 7.03E+10 for Al.

Poisson's ratio (v) was 0.17 for Si, 0.25 for $SiO_2$, 0.35 for Al.

Thermal expansion coefficient ($kelvin^{-1}$) was 2.60E-06 for Si, 5.60E-07 for $SiO_2$, 2.33E-05 for Al.

Moreover, the length dimension L1 of the first insulating layer 103 was 70 μm, and the entire length dimension of the fixed electrode portion 116 was 350 μm.

The thickness was 100 μm for the first and second substrates 101 and 102, 1.5 μm for the first insulating layer 103, 20 μm for the fixed electrode portion 116, and 3 μm for the second insulating layer 130.

The length dimension W0 of the bonding layer 132 was 20 μm, and the thickness dimension T0 of the bonding layer 132 was changed in the range of 0.5 μm to 10 μm. For each thickness, the amounts of displacement in the δ direction of the lower extreme end portion P1 and the upper extreme end portion P2 of the fixed electrode portion 116 due to the thermal stress of the bonding layer 132 when heated to 75° C. were calculated.

Figure 9:
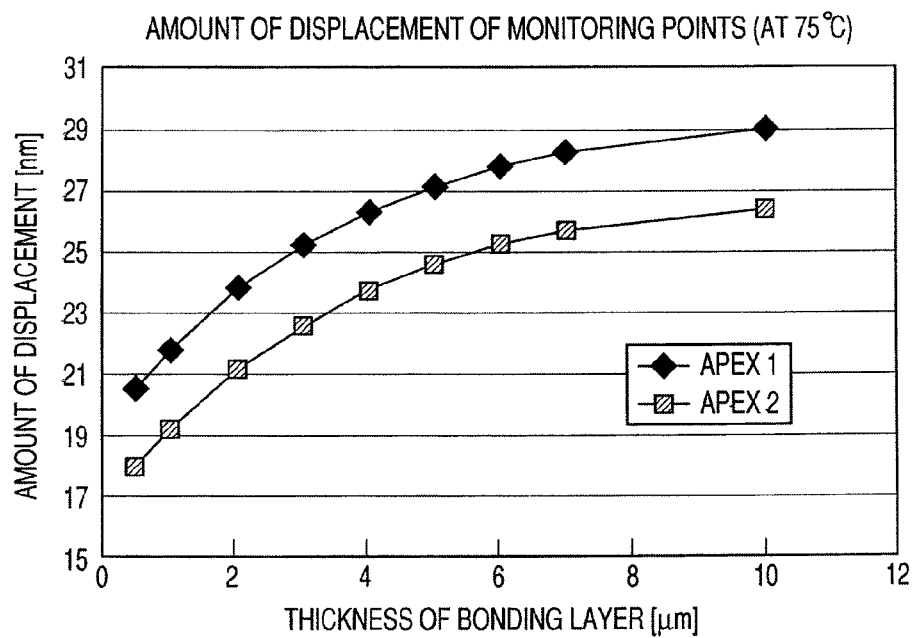
FIG. 9 is a graph illustrating the simulation results.

In FIG. 9, the horizontal axis represents the thickness T0 (in units of μm) of the bonding layer 132, and the vertical axis represents the amounts of displacement (in units of nm) of P1 and P2. In FIG. 9, the lower extreme end portion P1 is denoted by "Apex 1," and the upper extreme end portion P2 is denoted by "Apex 2."

From the results illustrated in FIG. 9, the thickness W0 of the bonding layer 132 is preferably about 4 μm or smaller, and more preferably is 1 μm or smaller.

In other words, in the above-described embodiment, the thickness dimension of the connection electrode portions 31 and 32 or the entire thickness dimension of the bonding layer is preferably about 4 μm or smaller, and more preferably is 1 μm or smaller.

[Fourth Embodiment]

Figure 10:
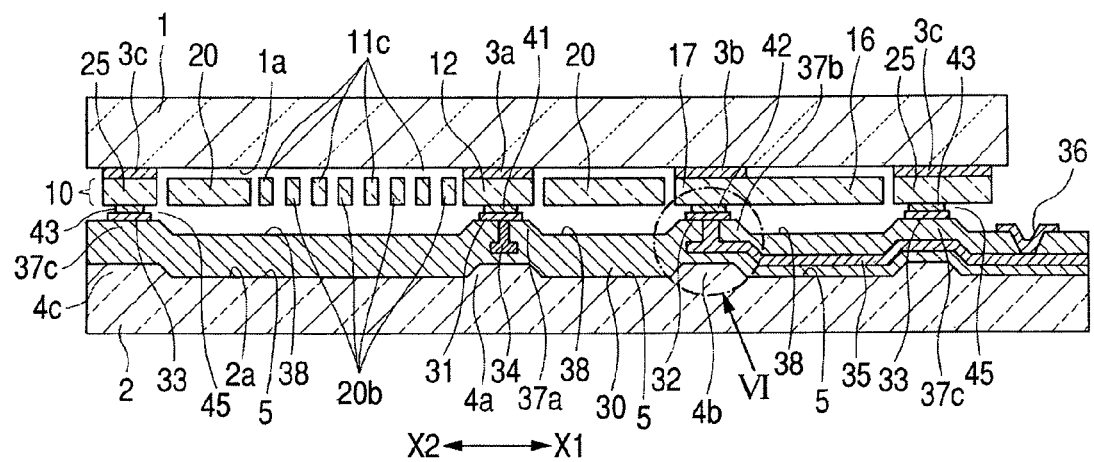
FIG. 10 is a cross-sectional view illustrating the stack structure of a MEMS sensor according to a fourth embodiment of the invention, taken along the IV-IV lines in FIG. 1.

FIG. 10 is a cross-sectional view illustrating a MEMS sensor according to the fourth embodiment of the invention. In the following description, reference is made to FIGS. 1 to 3, which illustrate the MEMS sensor according to the first embodiment, as necessary.

As illustrated in FIG. 10, the conductive supporting portion 17 that is continuous to the first supporting arm portion 16 and the surface 1a of the first substrate 1 are fixedly secured together via the first insulating layer 3b. The conductive supporting portion 19 that is continuous to the second supporting arm portion 18 and the surface 1a of the first substrate 1 are fixedly secured together via the first insulating layer 3b. In the movable electrode portion 15, only the conductive supporting portion 17 and the conductive supporting portion 19 are fixedly secured to the first substrate 1 via the first insulating layer 3b. In the remaining portions thereof, namely in the first supporting arm portion 16, the second supporting arm portion 18, the spindle part 20, the movable counter electrodes 20a, 20b, 20c, and 20d, and the elastic supporting portions 21, 22, 23, and 24, the insulating layer between the movable electrode portion 15 and the surface 1a of the first substrate 1 is removed, so that a clearance gap corresponding to the thickness dimension of the first insulating layer 3b is defined between these respective portions and the surface 1a of the first substrate 1.

The elastic supporting portions 21, 22, 23, and 24 are formed of a thin plated spring portion which is cut from a silicon wafer into a meandering pattern. By deformation of the elastic supporting portions 21, 22, 23, and 24, the spindle part 20 is able to move in the Y1 or Y2 direction.

As illustrated in FIG. 1, the frame layer 25 is formed by cutting the silicon wafer, for forming the functional layer 10, into a rectangular frame shape. The first insulating layer 3c is left between the frame layer 25 and the surface 1a of the first substrate 1. The first insulating layer 3c is provided so as to surround the entire circumference of the movable region of the movable electrode portion 15.

Figure 11:
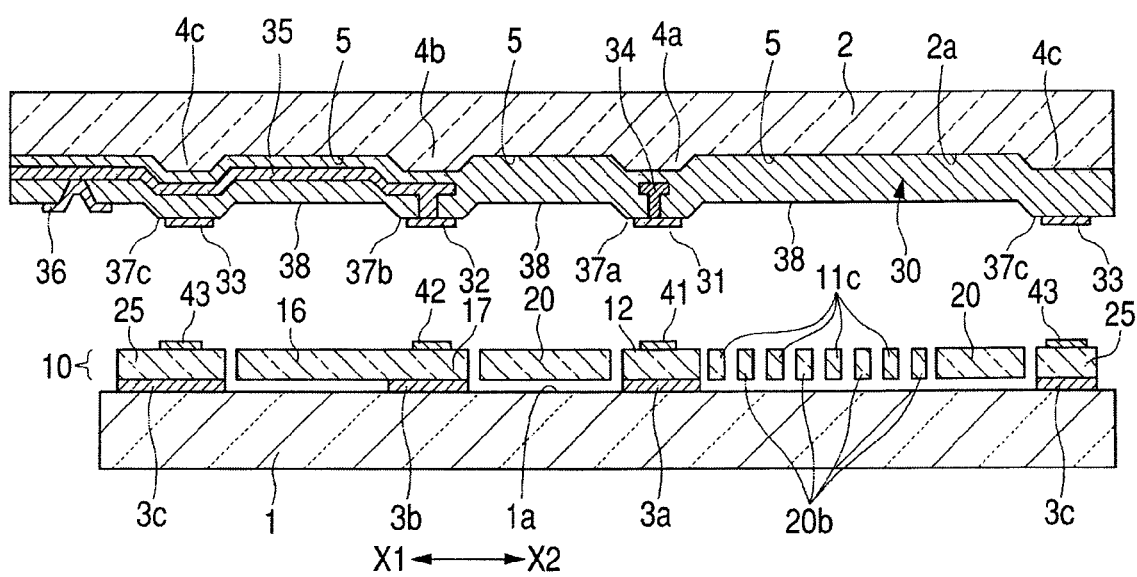
FIG. 11 is a cross-sectional view illustrating the method for fabricating the MEMS sensor.

The functional layer 10 illustrated in FIGS. 10 and 11 can be fabricated by the following method. First, using a SOI layer in which two sheets of silicon wafer are bonded together via an insulating layer, a resist layer is formed on the surface of one silicon wafer so as to cover the first fixed electrode portion 11, the second fixed electrode portion 13, the movable electrode portion 15, and the frame layer 25. Next, portions of the silicon wafer exposed from the resist layer are removed by an ion-etching means such as the deep RIE process that uses high-density plasma, whereby the first fixed electrode portion 11, the second fixed electrode portion 13, the movable electrode portion 15, and the frame layer 25 are spaced apart from each other.

At that time, a number of micropores are formed over all of the regions, excluding the conductive supporting portions 12, 14, 17, and 19 and the frame layer 25 by the deep RIE process. Referring to FIGS. 2 and 3, micropores 11d are formed on the counter electrodes 11c, micropores 13d are formed on the counter electrodes 13c, and micropores 20e are formed on the spindle part 20.

After the silicon wafer is subjected to the etching process by the deep RIE process, or the like, a selective isotropic etching process is performed which is capable of dissolving the $SiO_2$ layer of the insulating layer without dissolving silicon. At this time, etching gas or etching solution permeates through grooves that separate the respective portions of the silicon wafer and further permeates through the micropores 11d, 13d, and 20e, whereby the insulating layer is removed.

As a result, the insulating layers are left as the first insulating layers 3a, 3b, and 3c only between the conductive supporting portions 12, 14, 17, and 19 and the frame layer 25, and the surface 1a of the first substrate 1, and the insulating layer in the remaining portions is removed.

The result of processing the SOI layer is as follows: the first substrate 1 has a thickness dimension of around 0.2 to 0.7 mm; the functional layer 10 has a thickness dimension of around 10 to 30 µm; and the first insulating layer 3a, 3b, or 3c has a thickness dimension of around 1 to 3 µm.

The second substrate 2 is formed of one sheet of silicon wafer having a thickness dimension of around 0.2 to 0.7 mm.

As illustrated in FIGS. 10 and 11, uneven surfaces are formed on the surface 2a of the second substrate 2 by etching. On the surface 2a, a convex portion 4a configured to oppose the conductive supporting portion 12 of the first fixed electrode portion 11, a convex portion 4a configured to oppose the conductive supporting portion 14 of the second fixed electrode portion 13, and convex portions 4b configured to oppose the respective conductive supporting portions 17 and 19 of the movable electrode portion 15 are formed. Furthermore, on the surface 2a, a rectangular frame-shaped convex portion 4c is formed so as to surround the circumference of the movable region of the movable electrode portion 15. The convex portion 4c is configured to oppose the frame layer 25.

On the surface 2a of the second substrate 2, concave portions 5 are formed on at least regions where they oppose the spindle part 20, which is the moving part of the movable electrode portion 15, and the movable counter electrodes 20a, 20b, and 20c. All the surfaces of the convex portions 4a, 4b, and 4c are even relative to each other.

A second insulating layer 30 is formed on a surface 2a of the second substrate 2. The second insulating layer 30 is an inorganic insulating layer of $SiO_2$, SiN, $Al_2O_3$, or the like, and is formed by a sputtering process or a CVD process. As the inorganic insulating layer, materials exhibiting a smaller difference in the thermal expansion coefficient from that of the silicon wafer than the difference in the thermal expansion coefficient between the conductive metal constituting the connection electrode portions and the silicon wafer are chosen. Preferably, materials such as $SiO_2$ or SiN are used which exhibit a relatively small difference in the thermal expansion coefficient from that of the silicon wafer.

The second insulating layer 30 is formed to a uniform thickness so as to resemble the convex portions 4a, 4b, and 4c and the concave portions 5. As a result, convex portions 37a, 37b, and 37c are formed on portions of the surface of the second insulating layer 30 covering the convex portions 4a, 4b, and 4c of the second substrate 2. The convex portions 37a are configured to individually oppose the conductive supporting portion 12 of the first fixed electrode portion 11 and the conductive supporting portion 14 of the second fixed electrode portion 13, and the convex portions 37b are configured to individually oppose the conductive supporting portions 17 and 19 of the movable electrode portion 15. Moreover, the convex portion 4c is configured to oppose the frame layer 25 and surround the entire circumference of the movable region of the movable electrode portion 15.

Moreover, concave portions 38 are formed on portions of the surface of the second insulating layer 30 covering the concave portions 5. The concave portions 38 are configured to at least oppose the spindle part 20, which is the moving part of the movable electrode portion 15, and the movable counter electrodes 20a, 20b, and 20c.

As illustrated in FIGS. 10 and 11, on the surfaces of the convex portions 37a of the second insulating layer 30, connection electrode portions 31 configured to oppose the conductive supporting portion 12 of the first fixed electrode portion 11 and the conductive supporting portion 14 of the second fixed electrode portion 13 are formed. Moreover, on the surfaces of the convex portions 37b of the second insulating layer 30, connection electrode portions 32 configured to oppose the conductive supporting portion 17 and the conductive supporting portion 19 of the movable electrode portion 15 are formed.

On the surface of the convex portion 37c of the second insulating layer 30, a sealing electrode portion 33 configured to oppose the surface of the frame layer 25 is formed. The sealing electrode portion 33 is formed of the same conductive metal as the connection electrode portions 31 and 32. The sealing electrode portion 33 is formed into a rectangular frame shape to oppose the frame layer 25 and surround the entire circumference of the movable region of the movable electrode portion 15. The connection electrode portions 31 and 32 and the sealing electrode portion 33 are formed of aluminum (Al).

Inside the second insulating layer 30, a lead layer 34 that is electrically connected to one connection electrode portion 31 and a lead layer 35 that is electrically connected to the other connection electrode portion 32 are formed. The lead layers 34 and 35 are formed of aluminum. The plurality of lead layers 34 and 35 are individually electrically connected to respective connection electrode portions 31 and 32. The respective lead layers 34 and 35 are configured to pass through the inside of the second insulating layer 30 to intersect the portion where the sealing electrode portion 33 is formed, without contacting the sealing electrode portion 33, to be extended to the outside of the region surrounded by the sealing electrode portion 33. The second substrate 2 is provided with connection pads 36 which are electrically connected to the respective lead layers 34 and 35 at the outside of the region. The connection pads 36 are formed of aluminum, gold, and the like which are conductive materials having low resistance and are not prone to being oxidized.

Since the second insulating layer 30 is formed to a uniform thickness dimension, and the lead layers 34 and 35 are buried and drawn into the second insulating layer 30, it is possible to ensure a sufficient electrical isolation between the lead layers 34 and 35 and the second substrate 2. Moreover, it is possible to prevent the lead layers 34 and 35 from being unexpectedly exposed to the functional layer 10.

The second insulating layer 30 can be formed by the following method. First, the convex portions 4a, 4b, and 4c and the concave portions 5 are formed on the surface 2a of the second substrate 2 by an etching process, and an inorganic insulating layer is subsequently formed to a uniform thickness on the surface 2a of the second substrate 2 by a sputtering process or a CVD process. Next, on the inorganic insulating layer, the lead layers 34 and 35 are formed by a sputtering process, or the like, and another inorganic insulating layer is subsequently formed by a sputtering process or a CVD process so as to cover the lead layers 34 and 35.

As illustrated in FIG. 11, a metallic connection layer 41 is formed on the surfaces of the conductive supporting portions 12 and 14 of the functional layer 10 so as to oppose the connection electrode portion 31 by a sputtering process. Similarly, another metallic connection layer 42 is formed on the surfaces of the conductive supporting portions 17 and 19 so as to oppose the connection electrode portion 32 by a sputtering process. Moreover, a metallic sealing layer 43 is formed on the surface of the frame layer 25 so as to oppose the sealing electrode portion 33. The metallic sealing layer is formed of the same metallic material as, and simultaneously with, the metallic connection layers 41 and 42.

The metallic connection layers 41 and 42 and the metallic sealing layer 43 are formed of germanium which is a metallic material that is likely to be bonded with aluminum for forming the connection electrode portions 31 and 32 and the sealing electrode portion 33 by eutectic bonding or diffusion bonding.

As illustrated in FIG. 10, the first substrate 1 and the second substrate 2 are superimposed so that the surface 1a faces the surface 2a, the connection electrode portion 31 faces the metallic connection layer 41, the connection electrode portion 32 faces the metallic connection layer 42, and the sealing electrode portion 33 faces the metallic sealing layer 43. Then, the first substrate 1 and the second substrate 2 are heated and pressurized with a small force. In this way, the connection electrode portion 31 and the metallic connection layer 41 are bonded together by eutectic bonding or diffusion bonding, and the connection electrode portion 32 and the metallic connection layer 42 are bonded together by eutectic bonding or diffusion bonding. By the eutectic bonding or the diffusion bonding between the connection electrode portions 31 and 32 and the metallic connection layers 41 and 42, the conductive supporting portions 12, 14, 17, and 19 are immovably sandwiched between the first insulating layers 3a and 3b and the second insulating layer 30. Moreover, the connection electrode portions 31 and 31 are individually electrically connected to the conductive supporting portions 12 and 14, and the connection electrode portions 32 and 32 are individually electrically connected to the conductive supporting portions 17 and 19.

At the same time, the sealing electrode portion 33 and the metallic sealing layer 43 are bonded together by eutectic bonding or diffusion bonding. By the bonding, the frame layer 25 and the second insulating layer 30 are fixedly secured to each other, and a metallic sealing layer 45 is formed so as to surround the entire circumference of the movable region of the movable electrode portion 15.

Since the above-described MEMS sensor has such a structure that the SOI layer, which is composed of two sheets of silicon wafers bonded together via an insulating layer, is superimposed on another sheet of silicon wafer, it generally has a low profile. Moreover, the MEMS sensor has such a configuration that the conductive supporting portion 12 of the first fixed electrode portion 11, the conductive supporting portion 14 of the second fixed electrode portion 13, and the conductive supporting portions 17 and 19 of the movable electrode portion 15 are fixed by being sandwiched between the first insulating layers 3a and 3b and the second insulating layer 30, the conductive supporting portions 12, 14, 17, and 19 can be stably fixed.

The conductive supporting portions 12, 14, 17, and 19 and the second insulating layer 30 are bonded together by the eutectic bonding or the diffusion bonding between the connection electrode portions 31 and 32 and the metallic connection layers 41 and 42. However, the bonding layer is thin and occupies a small area and the conductive supporting portions 12, 14, 17, and 19 and the first substrate 1 are bonded together via the first insulating layers 3a and 3b, which are formed of an inorganic insulating material. Therefore, even when the ambient temperature increases, the thermal stress of the bonding layer can hardly affect the support structure of the conductive supporting portions 12, 14, 17, and 19. Thus, deformation, or the like, of the fixed electrode portions 11 and 13 or the movable electrode portion 15 due to the thermal stress is not likely to occur.

Similarly, the metallic sealing layer 45 surrounding the circumference of the movable region of the movable electrode portion 15 is configured by a thin bonding layer which is formed between the frame layer 25 and the second insulating layer 30, wherein the frame layer 25 has a sufficiently large thickness dimension. Therefore, deformation, or the like, of the first substrate 1 and the second substrate 2 due to the thermal stress of the metallic sealing layer 45 is not likely to occur.

The overall thickness dimension of the MEMS sensor can be substantially determined by the thickness dimensions of the first substrate 1 and the second substrate 2, the thickness dimension of the functional layer 10, and the thickness dimension of the second insulating layer 30. Since the thickness dimensions of the respective layers can be controlled with high precision, a thickness variation is not likely to occur. Moreover, since the second insulating layer 30 is formed with the concave portions 38, which are configured to oppose the movable region of the movable electrode portion 15, even if the MEMS sensor has a generally low profile, it is possible to provide movable clearance (margin) in the thickness direction to the movable electrode portion 15. Even when a large acceleration of force is applied in the thickness direction from the outside, the spindle part 20 and the movable counter electrodes 20a, 20b, 20c, and 20d might not come into contact with the second insulating layer 30, and thus, preventing any malfunction.

Moreover, since the second insulating layer 30 is formed to a uniform thickness, it is possible to ensure a sufficient electrical isolation between the lead layers 34 and 35 that are wired therein and the second substrate 2 and to prevent the lead layers 34 and 35 from being exposed to the surface of the second insulating layer 30.

The MEMS sensor can be used as an acceleration sensor that detects an acceleration of force in the Y1 or Y2 direction. For example, when an acceleration of force in the Y1 direction is applied to the MEMS sensor, the spindle part 20 of the movable electrode portion 15 is moved in the Y2 direction by a counteracting force. At this time, the opposing distance $\delta 1$ between the movable counter electrodes 20b and the fixed-side counter electrodes 11c, as illustrated in FIG. 2, is increased, so that the electrostatic capacitance between the movable counter electrodes 20b and the counter electrodes 11c decreases. At the same time, the opposing distance $\delta 2$ between the movable counter electrodes 20d and the counter electrodes 13c as illustrated in FIG. 3 is decreased, so that the electrostatic capacitance between the movable counter electrodes 20b and the counter electrodes 13c increases.

By detecting the decrease and increase in the electrostatic capacitance using an electric circuit and calculating a difference between a change in output due to the increase of the opposing distance δ1 and a change in output due to the decrease of the opposing distance δ2, it is possible to detect a change in the acceleration acting in the Y1 direction or the magnitude of the acceleration.

The MEMS sensor according to the invention may be configured to detect a change in the electrostatic capacitance between the movable counter electrodes and the counter electrodes in response to an acceleration of force in the direction perpendicular to the X-Y plane. Specifically, when the spindle part 20 of the movable electrode portion 15 is moved in the thickness direction in response to an acceleration of force in the direction perpendicular to the X-Y plane, the opposing state between the counter electrodes 11b, 11c, 13b, and 13c of the fixed electrode portions 11 and 13 and the movable counter electrodes 20a, 20b, and 20c of the movable electrode portion 15 is deviated in the thickness direction of the movable electrode portion 15, and thus the opposing area changes. The change in the opposing area is detected by the MEMS sensor as a change in the electrostatic capacitance between the movable counter electrodes and the counter electrodes of the fixed electrode portions 11 and 13.

[Fifth Embodiment]

Figure 12A:
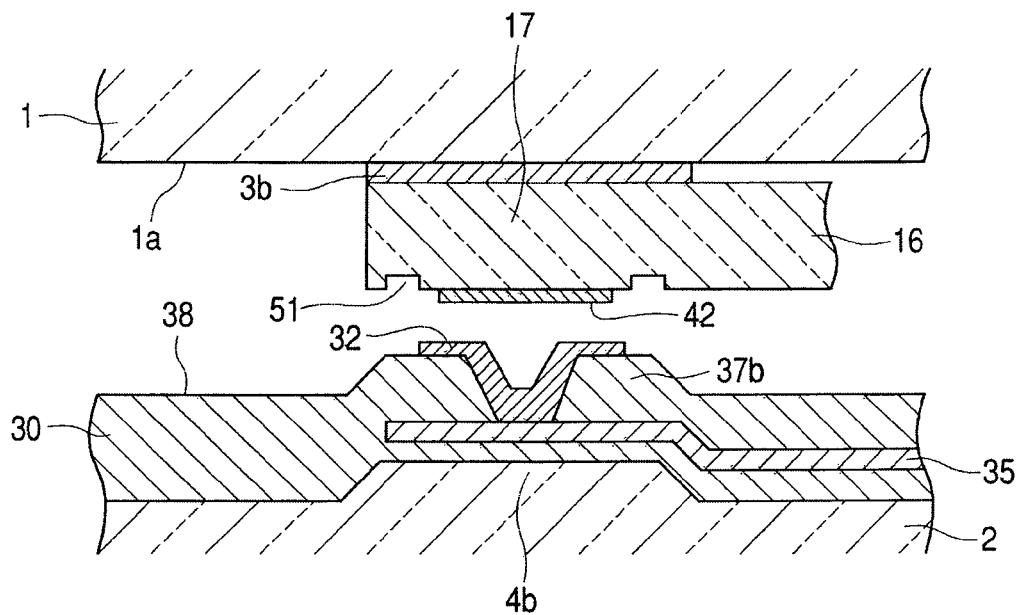
FIGS. 12A and 12B are enlarged cross-sectional views, of each embodiment, illustrating the detailed structure of the portion indicated by the arrow VI in FIG. 10.
Figure 12B:
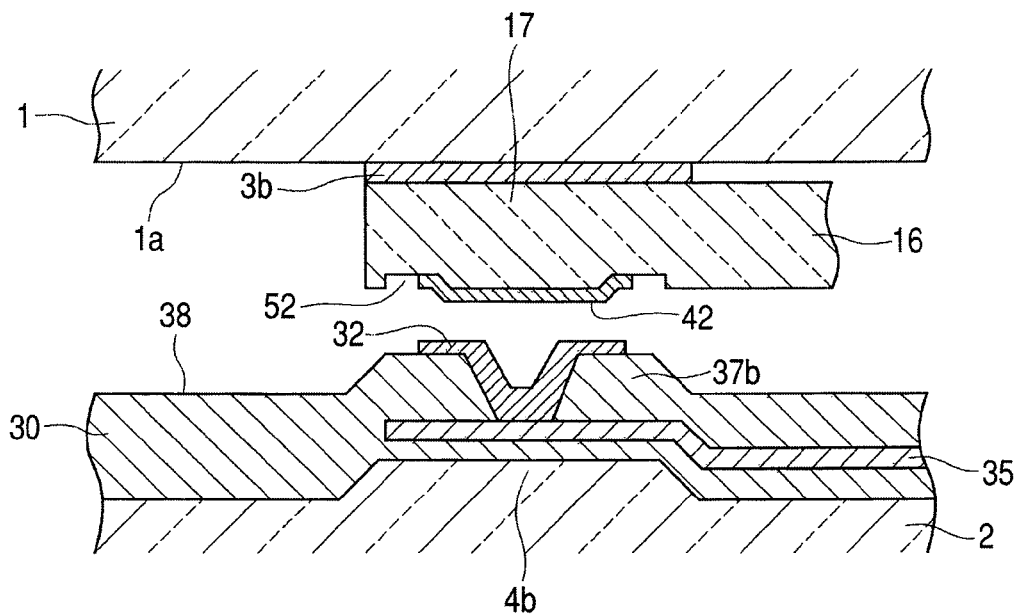

FIGS. 12A and 12B are cross-sectional views of a MEMS sensor according to the fifth embodiment of the invention, illustrating the VI portion in FIG. 4 in enlarged views.

In the embodiment illustrated in FIG. 12A, on the surface of the conductive supporting portion 17 of the movable electrode portion 15, a groove 51 is formed so as to surround the bonding portion of the metallic connection layer 42 and the connection electrode portion 32. The groove 51 may be continuously formed so as to surround the entire circumference of the bonding portion or may be discontinuously formed at intervals so as to surround the bonding portion.

In the embodiment illustrated in FIG. 12B, on the surface of the conductive supporting portion 17 of the movable electrode portion 15, a groove 52 is formed so as to surround the bonding portion of the metallic connection layer 42 and the connection electrode portion 32. The groove 52 is continuously formed so as to surround the circumference of the bonding portion, and a portion of the metallic bonding layer 42 is formed so as to be extended to the inside of the groove 52.

In the embodiments illustrated in FIGS. 12A and 12B, when the connection electrode portion 32 and the metallic connection layer 42 are bonded together by eutectic bonding or diffusion bonding, the molten metal is blocked at the groove 51 or 52. Therefore, it is possible to more certainly prevent the molten metal from flowing into the movable region of the spindle part 20 of the movable electrode portion 15 or the electrode opposing portion illustrated in FIGS. 2 and 3.

Although in the above-described embodiment, the connection electrode portions 31 and 32 and the sealing electrode portion 33 are formed of aluminum and the metallic connection layers 41 and 42 and the metallic sealing layer 43 are formed of germanium, combinations of metals capable of realizing eutectic bonding or diffusion bonding include aluminum-zinc, gold-silicon, gold-indium, gold-germanium, gold-tin, and the like. These combinations of metals enable bonding to be performed at a relatively low temperature of 450° C. or lower, which is equal to or lower than the melting point of the metals.

[Sixth Embodiment]

Figure 13:
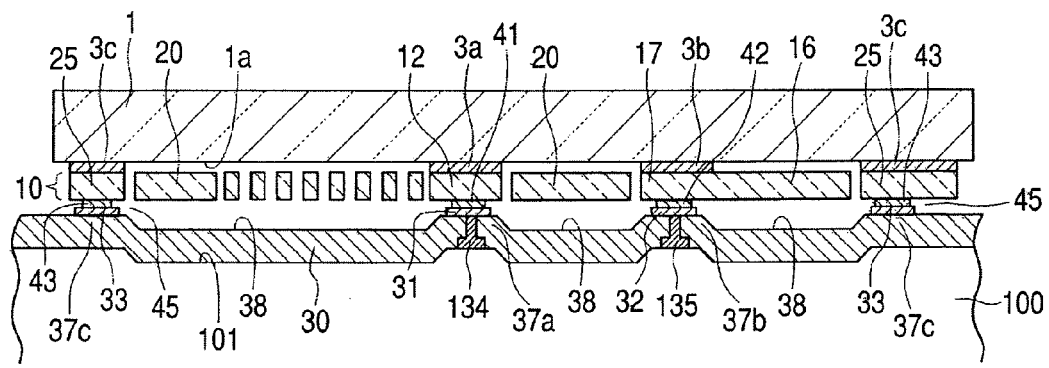
FIG. 13 is a cross-sectional view illustrating a sixth embodiment that uses an IC package in lieu of a second substrate.

FIG. 13 is a cross-sectional view illustrating a MEMS sensor according to the sixth embodiment of the invention.

The MEMS sensor uses an IC package 100 instead of the second substrate 2. The IC package 100 incorporates therein a detection circuit, or the like, capable of detecting a change in the electrostatic capacitance between the counter electrodes and the movable counter electrodes.

Convex portions and concave portions are formed on the upper surface 101 of the IC package 100, and the second insulating layer 30 is formed thereon to a uniform thickness. Since the second insulating layer 30 is formed so as to resemble the convex portions and the concave portions of the upper surface 101, convex portions 37a, 37b, and 37c and concave portions 38 are formed on the surface of the second insulating layer 30. Moreover, the connection electrode portions 31 and 32 and the sealing electrode portion 33 are formed on the surfaces of the convex portions 37a, 37b, and 37c. The connection electrode portions 31 and 32 are electrically connected to electrode pads that appear on the upper surface 101 of the IC package 100 via connection layers 134 and 135 such as through-holes configured to penetrate through the second insulating layer 30 and are connected to an electric circuit incorporated into the IC package 100.

In the MEMS sensor illustrated in FIG. 13, the functional layer 10 is disposed between the first substrate 1 and the second insulating layer 30, and the second insulating layer 30 is formed with a thickness dimension that can be controlled. Therefore, it is possible to stably hold the functional layer 10 without being greatly distant from the upper surface 101 of the IC package 100.

[Seventh Embodiment]

Figure 14:
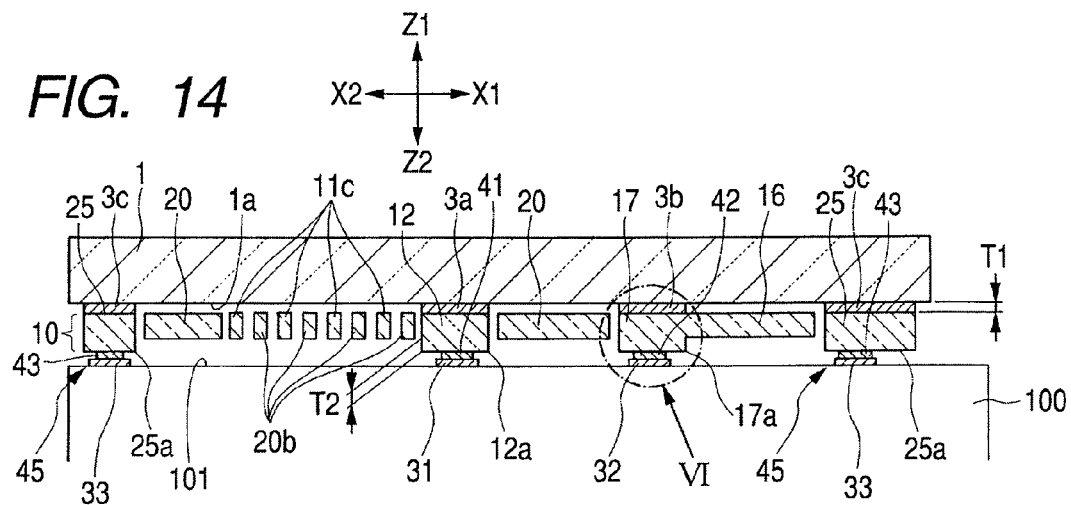
FIG. 14 is a cross-sectional view illustrating the stack structure of a MEMS sensor according to a seventh embodiment of the invention, taken along the IV-IV lines in FIG. 1.

FIG. 14 is a cross-sectional view illustrating a MEMS sensor according to the seventh embodiment of the invention. In the following description, reference is made to FIGS. 1 to 3, which illustrate the MEMS sensor according to the first embodiment, as necessary.

As illustrated in FIG. 14, the conductive supporting portion 17 that is continuous to the first supporting arm portion 16 and a surface 1a of a supporting substrate 1 are fixedly secured together via the first insulating layer 3b. The conductive supporting portion 19 that is continuous to the second supporting arm portion 18 and the surface 1a of the supporting substrate 1 are fixedly secured together via the first insulating layer 3b. In the movable electrode portion 15, only the conductive supporting portion 17 and the conductive supporting portion 19 are fixedly secured to the supporting substrate 1 via the first insulating layer 3b. In the remaining portions thereof, namely in the first supporting arm portion 16, the second supporting arm portion 18, the spindle part 20, the movable counter electrodes 20a, 20b, 20c, and 20d, and the elastic supporting portions 21, 22, 23, and 24, the insulating layer between the movable electrode portion 15 and the surface 1a of the supporting substrate 1 is removed, so that a clearance gap corresponding to the thickness dimension of the first insulating layer 3b is defined between these respective portions and the surface 1a of the supporting substrate 1.

The elastic supporting portions 21, 22, 23, and 24 are formed of a thin plated spring portion which is cut from a silicon wafer 10A into a meandering pattern. By deformation of the elastic supporting portions 21, 22, 23, and 24, the spindle part 20 is able to move in the Y1 or Y2 direction. The moving part of the movable electrode portion 15 is constituted by the spindle part 20 and the movable counter electrodes 20a, 20b, 20c, and 20d.

As illustrated in FIG. 1, the frame layer 25 is formed by cutting and leaving the circumferential portion of the silicon wafer 10A of the SOI layer 60 into a rectangular frame shape. The first insulating layer 3c is left between the frame layer 25 and the surface 1a of the supporting substrate 1. The first insulating layer 3c is provided so as to surround the first fixed electrode portion 11, the second fixed electrode portion 13, and the entire circumference of the movable region of the movable electrode portion 15.

As illustrated in FIG. 14, the respective surfaces close to the first side (Z1 side) (hereinafter, referred to as first-side surface or Z1-side surface), of the first fixed electrode portion 11, the second fixed electrode portion 13, the movable electrode portion 15, and the frame layer 25, which are cut from the same silicon wafer 10A, are even relative to each other. The distance T1 between the surfaces and the surface 1a of the supporting substrate 1 is determined by the thickness dimension of an insulating layer 3A (the first insulating layers 3a, 3b, and 3c) of the SOI layer 60.

On the other hand, a surface 12a close to the second side (Z2 side) (hereinafter, referred to as second-side surface or Z2-side surface), of the conductive supporting portion 12 of the first fixed electrode portion 11, a second-side surface 14a (not illustrated) of the conductive supporting portion 14 of the second fixed electrode portion 13, a second-side surface 17a of the conductive supporting portion 17 of the movable electrode portion 15, a second-side surface 19a (not illustrated) of the conductive supporting portion 19, and a second-side surface 25a of the frame layer 25 are even relative to each other.

Moreover, the second-side surfaces (Z2-side surfaces) of portions of the first fixed electrode portion 11 excluding the conductive supporting portion 12, namely the electrode supporting portion 11a and the counter electrodes 11b and 11c are recessed in the Z1 direction by a distance T2 from the surface 12a of the conductive supporting portion 12. Similarly, the second-side surfaces of the electrode supporting portion 13a and the counter electrodes 13b and 13c of the second fixed electrode portion 13 are recessed toward the Z1 side by the distance T2 from the surface 14a of the conductive supporting portion 14. Moreover, the second-side surfaces (Z2-side surfaces) of portions of the movable electrode portion 15 excluding the conductive supporting portions 17 and 19, namely the first supporting arm portion 16, the second supporting arm portion 18, the spindle part 20, the movable counter electrodes 20a, 20b, 20c, and 20d, and the elastic supporting portions 21, 22, 23, and 24 are recessed toward the Z1 side by the distance T2 from the second-side surfaces 17a and 19a of the conductive supporting portions 17 and 19.

As illustrated in FIG. 14, a metallic connection layer 41 is formed on the second-side surface 12a of the conductive supporting portion 12 of the first fixed electrode portion 11, and similarly, the metallic connection layer 41 is also formed on the second-side surface 14a of the conductive supporting portion 14 of the second fixed electrode portion 13. Moreover, a metallic connection layer 42 is formed on the second-side surface 17a of the conductive supporting portion 17 of the movable electrode portion 15, and similarly, the metallic connection layer 42 is also formed on the second-side surface 19a of the other conductive supporting portion 19.

As illustrated in FIG. 14, a metallic sealing layer 43 is formed on the second-side surface 25a of the frame layer 25. The metallic sealing layer 43 is formed into a rectangular frame pattern so as to surround the first fixed electrode portion 11, the second fixed electrode portion 13, and the entire circumference of the movable electrode portion 15.

FIGS. 17A to 17D are cross-sectional views illustrating the detailed fabrication method of the supporting substrate 1 and the functional layer 10.

Figure 17A:
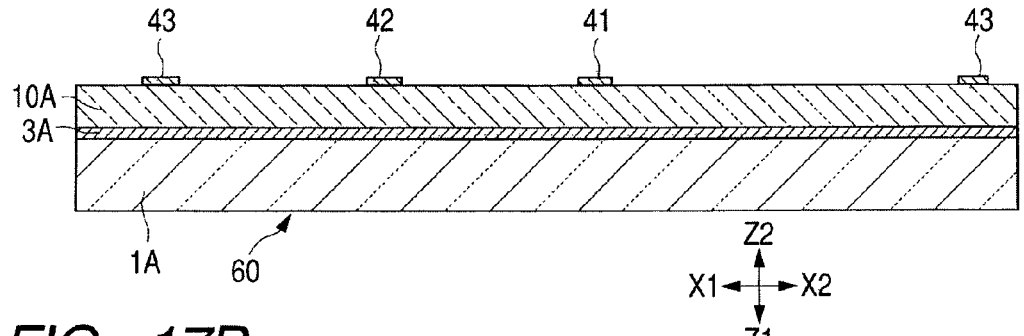
FIGS. 17A to 17D are cross-sectional views illustrating the process steps for fabricating the MEMS sensor.

As illustrated in FIG. 17A, using the SOI layer 60 in which the silicon wafer 1A and the silicon wafer 10A are bonded together via the insulating layer 3A, the metallic connection layer 41, the metallic connection layer 42, and the metallic sealing layer 43 are formed on the second-side surface (Z2-side surface) of the silicon wafer 10A by the same sputtering process.

Figure 17B:
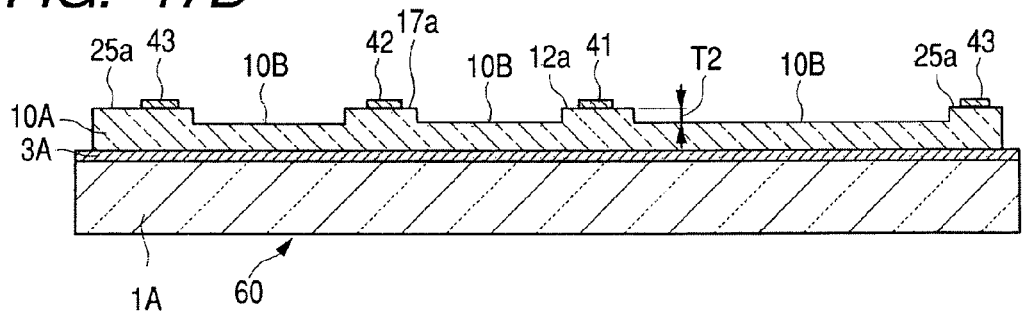

As illustrated in FIG. 17B, the second-side surface of the silicon wafer 10A is subjected to dry etching to form concave portions 10B. At this time, the portions corresponding to the second-side surfaces 12a and 14a of the conductive supporting portions 12 and 14, the second-side surfaces 17a and 19a of the conductive supporting portions 17 and 19, and the second-side surface 25a of the frame layer 25 are left, and portions of the silicon wafer 10A in the remaining portions are removed, whereby the concave portions 10B are formed. Therefore, the respective surfaces 12a, 14a, 17a, 19a, and 25a are even relative to each other. The depth dimension of the concave portions 10B is T2.

Figure 17C:
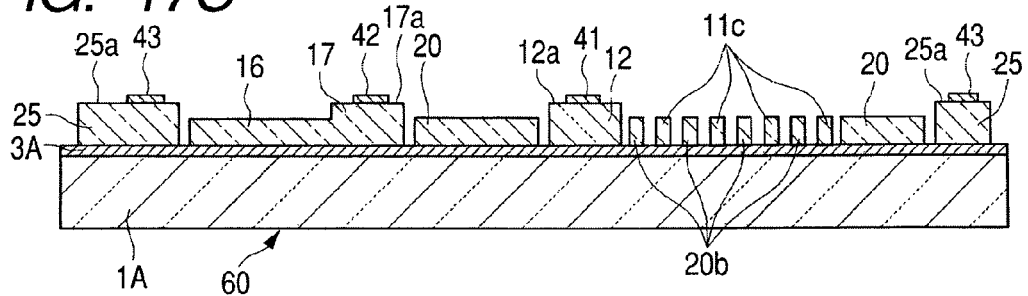

Next, a resist layer is formed on the second-side surface (Z2-side surface) of the silicon wafer 10A so as to cover the patterns of the first fixed electrode portion 11, the second fixed electrode portion 13, the movable electrode portion 15, and the frame layer 25. Then, portions of the silicon wafer 10A exposed from the resist layer are removed by an ion-etching means such as the deep RIE process that uses high-density plasma. As a result, as illustrated in FIG. 17C, the first fixed electrode portion 11, the second fixed electrode portion 13, the movable electrode portion 15, and the frame layer 25 are formed from the silicon wafer 10A so as to be spaced apart from each other.

At that time, a number of micropores are formed over all of the regions excluding the portions corresponding to the conductive supporting portions 12, 14, 17, and 19 and the frame layer 25 by the deep RIE process. Referring to FIGS. 2 and 3, micropores 11d are formed on the counter electrodes 11c, micropores 13d are formed on the counter electrodes 13c, and micropores 20e are formed on the spindle part 20.

After the silicon wafer is subjected to the etching processing by the deep RIE process, or the like, a selective isotropic etching process is performed which is capable of dissolving the $SiO_2$ layer of the insulating layer without dissolving silicon. At this time, etching gas or etching solution permeates through grooves that separate the respective portions of the silicon wafer 10A and further permeates through the micropores 11d, 13d, and 20e, whereby the insulating layer 3A is removed. As a result, as illustrated in FIG. 17D, the insulating layers are left as the first insulating layers 3a, 3b, and 3c only between the conductive supporting portions 12, 14, 17, and 19 and the frame layer 25, and the surface 1a of the supporting substrate 1, and the insulating layer 3A in the remaining portions is removed.

Figure 17D:
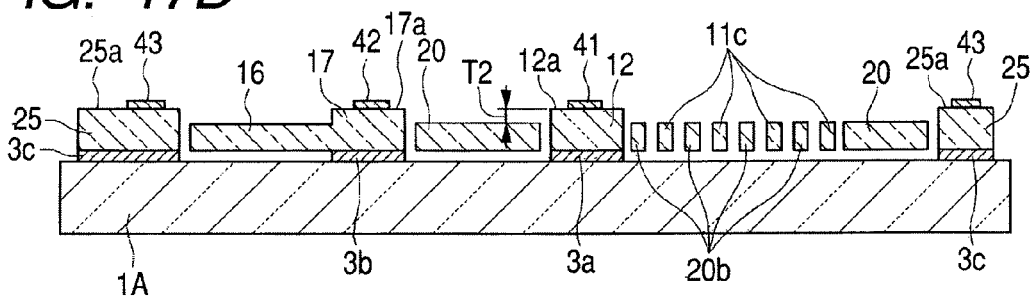

By performing the steps illustrated in FIG. 17B, where the concave portions 10B are formed to a depth of T2 in the silicon wafer 10A, and thereafter, the silicon wafer 10A is partitioned into respective portions, the functional layer 10 is formed such that the remaining portions are recessed toward the Z1 side by a distance T2 from the surfaces 12a, 14a, 17a, and 19a of the conductive supporting portions 12, 14, 17, and 19 and the surface 25a of the frame layer 25, as illustrated in FIG. 17D.

The result of processing the SOI layer 60 is as follows: the supporting substrate 1 has a thickness dimension of around 0.2 to 0.7 mm; the functional layer 10 has a thickness dimension of around 10 to 30 μm; and the first insulating layer 3a, 3b, or 3c has a thickness dimension of around 1 to 3 μm.

As illustrated in FIG. 14, an inorganic insulating layer $SiO_2$, SiN, $Al_2O_3$, or the like, is formed on the surface 101 of the IC package 100. At least a portion of the surface 101 opposing the functional layer 10 is configured as a flat surface.

On the surface 101, connection electrode portions 31 are formed so as to individually oppose the metallic connection layers 41 which are formed on the surface 12a of the conductive supporting portion 12 and the surface 14a of the conductive supporting portion 14. Moreover, connection electrode portions 32 are formed so as to individually oppose the metallic connection layers 42, which are formed on the surface 17a of the conductive supporting portion 17 and the surface 19a of the conductive supporting portion 19. Furthermore, a sealing electrode portion 33 is formed so as to oppose the metallic sealing layer 43 which is formed on the surface 25a of the frame layer 25. The sealing electrode portion 33 is formed into a rectangular frame shape so as to resemble the shape of the frame layer 25.

The connection electrode portions 31 and 32 and the sealing electrode portion 33 are formed of aluminum (Al) by a plating process or a sputtering process. The connection electrode portions 31 and 32 and the sealing electrode portion 33 are connected to an internal circuit of the IC package 100. As illustrated in FIGS. 17A to 17D, the metallic connection layers 41 and 42 and the metallic sealing layer 43 which are formed on the second-side surface (Z2-side surface) of the functional layer 10 are formed of germanium, which is a metallic material that is likely to be bonded with aluminum, for forming the connection electrode portions 31 and 32 and the sealing electrode portion 33 by eutectic bonding or diffusion bonding.

As illustrated in FIG. 14, a sensor laminate in which the supporting substrate 1 and the functional layer 10 are integrated together is superimposed on the surface 101 of the IC package 100 so that the connection electrode portion 31 faces the metallic connection layer 41, the connection electrode portion 32 faces the metallic connection layer 42, and the sealing electrode portion 33 faces the metallic sealing layer 43. Then, the supporting substrate 1 and the IC package 100 are heated and pressurized with a small force. In this way, the connection electrode portion 31 and the metallic connection layer 41 are bonded together by eutectic bonding or diffusion bonding, and the connection electrode portion 32 and the metallic connection layer 42 are bonded together by eutectic bonding or diffusion bonding. By the eutectic bonding or the diffusion bonding between the connection electrode portions 31 and 32 and the metallic connection layers 41 and 42, the conductive supporting portions 12, 14, 17, and 19 are immovably sandwiched between the first insulating layers 3a and 3b and the surface 101 of the IC package 100. Moreover, the connection electrode portions 31 and 31 are individually electrically connected to the conductive supporting portions 12 and 14, and the connection electrode portions 32 and 32 are individually electrically connected to the conductive supporting portions 17 and 19.

At the same time, the sealing electrode portion 33 and the metallic sealing layer 43 are bonded together by eutectic bonding or diffusion bonding. Through the bonding, the frame layer 25 and the surface 101 of the IC package 100 are fixedly secured to each other, and a thin metallic sealing layer 45 is formed so as to surround the first fixed electrode portion 11, the second fixed electrode portion 13, and the entire circumference of the movable electrode portion 15.

The above-described MEMS sensor has such a low-profile structure that it is formed by the SOI layer 60 which is composed of two sheets of silicon wafer 1A and 10A bonded together via the insulating layer 3A, as illustrated in FIG. 17A, and the protrusion dimension from the surface 101 in the Z1 direction in a state of being mounted on the surface 101 of the IC package 100 can be decreased. The metallic sealing layer 45 is formed between the supporting substrate 1 and the surface 101 of the IC package 100 so as to surround the outer circumference of the movable region of the movable electrode portion 15. Therefore, it is possible to obtain a MEMS sensor having a low profile and a hermetically sealed movable space therein.

The conductive supporting portions 12, 14, 17, and 19 and the second insulating layer 30 are bonded together by the eutectic bonding or the diffusion bonding between the connection electrode portions 31 and 32 and the metallic connection layers 41 and 42. However, the bonding layer is thin and occupies a small area and the conductive supporting portions 12, 14, 17, and 19 and the supporting substrate 1 are bonded together via the first insulating layers 3a and 3b which are formed of an inorganic insulating material. Therefore, even when the ambient temperature increases, the thermal stress of the bonding layer can hardly affect the support structure of the conductive supporting portions 12, 14, 17, and 19. Thus, deformation, or the like, of the fixed electrode portions 11 and 13 or the movable electrode portion 15 due to the thermal stress is not likely to occur.

Similarly, the metallic sealing layer 45 surrounding the circumference of the movable region of the movable electrode portion 15 is configured by a thin bonding layer which is formed by eutectic bonding or diffusion bonding between the frame layer 25 and the surface 101 of the IC package 100, where the frame layer 25 has a sufficiently large thickness dimension. Therefore, deformation, or the like, of the respective portions of the functional layer 10 or the supporting substrate 1 due to the thermal stress of the metallic sealing layer 45 is not likely to occur.

The remaining portions of the MEMS sensor are recessed toward the Z1 side from the surfaces 12a, 14a, 17a, and 19a of the conductive supporting portions 12, 14, 17, and 19 of the functional layer 10 and the surface 25a of the frame layer 25 so as to be distant from the surface 101 of the IC package 100. Therefore, even when the surface 101 of the IC package 100 is not subjected to any special processing, it is possible to ensure, by the distance T2, a movable clearance in the Z2 direction of the spindle part 20 and the movable counter electrodes 20a, 20b, 20c, and 20d, which are the moving part of the movable electrode portion 15. Accordingly, it is possible to prevent the moving part from making unexpected collisions with the surface 101 of the IC package 100 when an acceleration of force in the vertical direction is applied thereto.

The MEMS sensor can be used as an acceleration sensor that detects an acceleration of force in the Y1 or Y2 direction. For example, when an acceleration of force in the Y1 direction is applied to the MEMS sensor, the spindle part 20 of the movable electrode portion 15 is moved in the Y2 direction by a counteracting force. At this time, the opposing distance δ1 between the movable counter electrodes 20b and the fixed-side counter electrodes 11c as illustrated in FIG. 2 is increased, so that the electrostatic capacitance between the movable counter electrodes 20b and the counter electrodes 11c decreases. At the same time, the opposing distance δ2 between the movable counter electrodes 20d and the counter electrodes 13c as illustrated in FIG. 3 is decreased, so that the electrostatic capacitance between the movable counter electrodes 20b and the counter electrodes 13c increases.

By detecting the decrease and increase in the electrostatic capacitance using a detection circuit in the IC package 100 and calculating a difference between a change in output due to the increase of the opposing distance δ1 and a change in output due to the decrease of the opposing distance δ2, it is possible to detect a change in the acceleration acting in the Y1 direction or the magnitude of the acceleration.

The MEMS sensor according to the invention may be configured to detect a change in the electrostatic capacitance between the movable counter electrodes and the counter electrodes in response to an acceleration of force in the direction perpendicular to the X-Y plane. Specifically, when the spindle part 20 of the movable electrode portion 15 is moved in the thickness direction in response to an acceleration of force in the direction perpendicular to the X-Y plane, the opposing state between the counter electrodes 11b, 11c, 13b, and 13c of the fixed electrode portions 11 and 13 and the movable counter electrodes 20a, 20b, and 20c of the movable electrode portion 15 deviates in the thickness direction of the movable electrode portion 15, and thus the opposing area changes. The change in the opposing area is detected by the MEMS sensor as the change in the electrostatic capacitance between the movable counter electrodes and the counter electrodes.

[Eighth Embodiment]

Figure 16A:
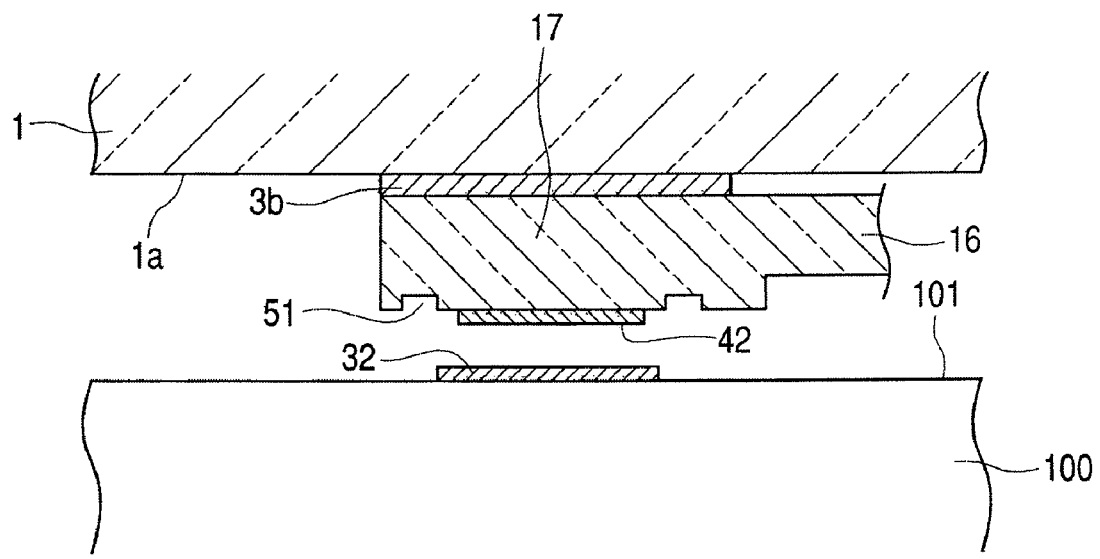
FIGS. 16A and 16B are enlarged cross-sectional views, of each embodiment, illustrating the detailed structure of the portion indicated by the arrow VI in FIG. 14.
Figure 16B:
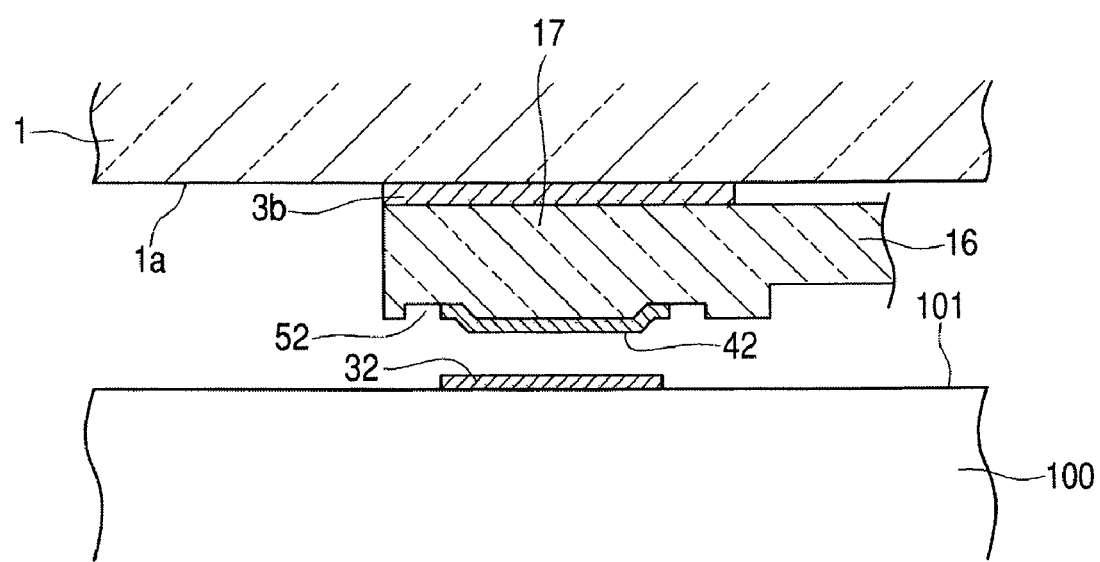

FIGS. 16A and 16B are cross-sectional views of a MEMS sensor according to the eighth embodiment of the invention, illustrating the VI portion in FIG. 14 in enlarged views.

In the embodiment illustrated in FIG. 16A, on the surface of the conductive supporting portion 17 of the movable electrode portion 15, a groove 51 is formed so as to surround the bonding portion of the metallic connection layer 42 and the connection electrode portion 32. The groove 51 may be continuously formed so as to surround the entire circumference of the bonding portion or may be discontinuously formed at intervals so as to surround the bonding portion.

In the embodiment illustrated in FIG. 16B, on the surface of the conductive supporting portion 17 of the movable electrode portion 15, a groove 52 is formed so as to surround the bonding portion of the metallic connection layer 42 and the connection electrode portion 32. The groove 52 is continuously formed so as to surround the circumference of the bonding layer, and a portion of the metallic bonding layer 42 is formed so as to be extended to the inside of the groove 52.

In the embodiments illustrated in FIGS. 16A and 16B, when the connection electrode portion 32 and the metallic connection layer 42 are bonded together by eutectic bonding or diffusion bonding, the molten metal is blocked at the groove 51 or 52. Therefore, it is possible to more certainly prevent the molten metal from flowing into the movable region of the spindle part 20 of the movable electrode portion 15 or the electrode opposing portion illustrated in FIGS. 2 and 3.

Although in the above-described embodiment, the connection electrode portions 31 and 32 and the sealing electrode portion 33 are formed of aluminum and the metallic connection layers 41 and 42 and the metallic sealing layer 43 are formed of germanium, combinations of metals capable of realizing eutectic bonding or diffusion bonding include aluminum-zinc, gold-silicon, gold-indium, gold-germanium, gold-tin, and the like. These combinations of metals enable bonding to be performed at a relatively low temperature of 450° C. or lower, which is equal to or lower than the melting point of the metals.

[Ninth Embodiment]

Figure 15:
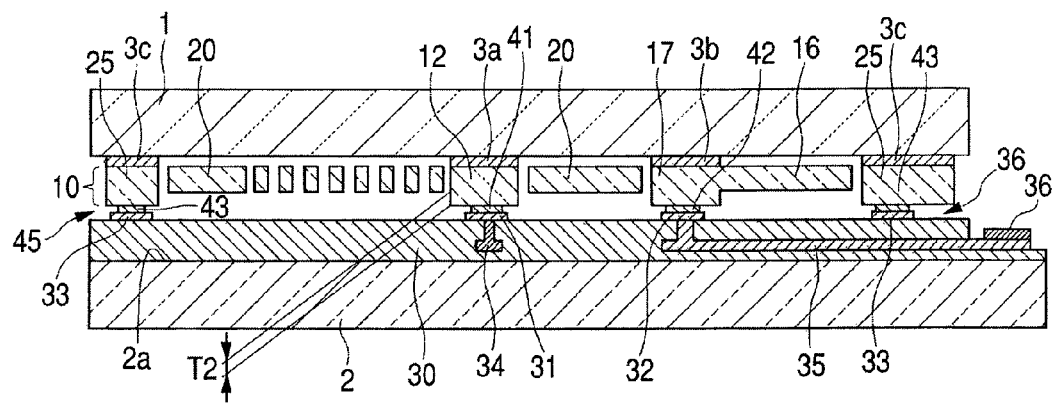
FIG. 15 is a cross-sectional view of a MEMS sensor according to a ninth embodiment of the invention.

FIG. 15 is a cross-sectional view illustrating a MEMS sensor according to the ninth embodiment of the invention.

The MEMS sensor according to the embodiment illustrated in FIG. 15 has a configuration such that the functional layer 10 is superimposed and bonded to the surface of a cap substrate 2. The cap substrate 2 serving as a support base is formed of one sheet of silicon wafer having a thickness dimension of about 0.4 to 0.7 mm.

As illustrated in FIG. 15, a second insulating layer 30 is formed on the surface 2a of the cap substrate 2. The second insulating layer 30 is an inorganic insulating layer of $SiO_2$, SiN, $Al_2O_3$, or the like, and is formed to a uniform thickness by a sputtering process or a CVD process. As the inorganic insulating layer, materials exhibiting a smaller difference in the thermal expansion coefficient from that of the silicon wafer than the difference in the thermal expansion coefficient between the conductive metal constituting the connection electrode portions 31 and 32 and the silicon wafer are chosen. Preferably, materials such as $SiO_2$ or SiN are used which exhibit a relatively small difference in the thermal expansion coefficient from that of the silicon wafer.

On the surface of the second insulating layer 30, connection electrode portions 31, connection electrode portions 32, and a sealing electrode portion 33 are formed. Inside the second insulating layer 30, lead layers 34 configured to be individually electrically connected to the connection electrode portions 31 and lead layers 35 configured to be individually electrically connected to the connection electrode portions 32 are formed. These lead layers 34 and 35 are configured to pass through the inside of the second insulating layer 30 to be extended to the outside of the region, on which the functional layer 10 is superimposed, and connected to external connection pads 36 which are formed on the cap substrate 2.

The connection electrode portions 31 and the metallic connection layer 41 are bonded together by eutectic bonding or diffusion bonding, and the connection electrode portions 32 and the metallic connection layer 42 are bonded together by eutectic bonding or diffusion bonding, so that the change in the electrostatic capacitance can be detected from the lead layers 34 and 35 and the external connection pads 36. Moreover, the sealing electrode portion 33 and the metallic sealing layer 43 are bonded together by eutectic bonding or diffusion bonding, whereby a metallic sealing layer 45 is formed.

Since the MEMS sensor illustrated in FIG. 15 is configured such that the supporting substrate 1 and the functional layer 10 which are obtained by processing the SOI layer 60 are superimposed on the cap substrate 2 formed from a single substrate, the MEMS sensor can be configured into a low profile. Moreover, even when the cap substrate 2 is not subjected to any special processing, it is possible to provide a movable clearance of the distance T2 to the moving part of the movable electrode portion 15. Since the cap substrate 2 and the second insulating layer 30 can be formed to a uniform thickness, it is possible to ensure a sufficient strength even when the cap substrate 2 and the second insulating layer 30 are made to be thin.

It should be understood by those skilled in the art that various modifications, combinations, sub-combinations and alterations may occur depending on design requirements and other factors insofar as they are within the scope of the appended claims of the equivalents thereof.

What is claimed is:
1. A MEMS sensor comprising:
 a first substrate;
 a second substrate;
 a movable electrode portion and a fixed electrode portion, which are arranged between the first substrate and the second substrate, wherein:

conductive supporting portions of the movable electrode portion and the fixed electrode portion are, respectively, fixedly secured to a surface of the first substrate via a first insulating layer;

a second insulating layer, a lead layer buried into the second insulating layer, and connection electrode portions that are electrically connected to the lead layer to be individually connected to the conductive supporting portions are provided on a surface of the second substrate;

a metallic connection layer is formed on the surface of one of the respective conductive supporting portions;

one of the respective connection electrode portions and the metallic connection layer are bonded together by one of eutectic bonding or diffusion bonding;

bonded layers have a thickness of about 4 µm or smaller; and a concave portion is formed on the second insulating layer so as to oppose the movable electrode portion.

2. The MEMS sensor according to claim 1, wherein a continuous or discontinuous groove is disposed in the conductive supporting portions so as to surround a bonding layer between the connection electrode portions and the metallic connection layer, the continuous or discontinuous groove is disposed on the surface where the bonding layer is disposed so as to surround the bonding layer.

3. The MEMS sensor according to claim 1, wherein:

a frame layer is formed so as to surround a movable region of the movable electrode portion, the frame layer being formed of the same material, and with the same thickness, as the movable electrode portion and the fixed electrode portion;

the first substrate and the frame layer are bonded together on the circumference of the movable region via the same insulating layer as the first insulating layer;

a sealing electrode portion formed of the same metallic material as the connection electrode portions is disposed on the surface of the second insulating layer;

a metallic sealing layer formed of the same metallic material as the metallic connection layer is disposed on the surface of the frame layer;

the sealing electrode portion and the metallic sealing layer are bonded together by eutectic bonding or diffusion bonding, whereby a sealing layer is formed so as to surround the circumference of the movable region; and the lead layer buried into the second insulating layer is drawn out to the outside of the sealing layer, and connection pads which are electrically connected to the lead layer are provided to the second substrate.

4. The MEMS sensor according to claim 1, wherein an IC package is used in lieu of the second substrate, and the connection electrode portions are connected to electrode pads of the IC package by a connection layer which is formed in lieu of the lead layer so as to penetrate through the second insulating layer.

* * * * *

UNITED STATES PATENT AND TRADEMARK OFFICE
CERTIFICATE OF CORRECTION

PATENT NO. : 8,207,586 B2
APPLICATION NO. : 12/560645
DATED : June 26, 2012
INVENTOR(S) : Kiyoshi Sato et al.

It is certified that error appears in the above-identified patent and that said Letters Patent is hereby corrected as shown below:

In the Claims

In column 24, claim 1, line 64, after "a second substrate;" insert --and--.

In column 25, claim 1, line 11, after "connection layer is" replace "formed" with --disposed--.

In column 25, claim 1, line 18, after "a concave portion is" replace "formed" with --disposed--.

Signed and Sealed this
Sixteenth Day of October, 2012

David J. Kappos
*Director of the United States Patent and Trademark Office*